United States Patent
Irie

(10) Patent No.: US 9,323,152 B2
(45) Date of Patent: Apr. 26, 2016

(54) CHEMICALLY AMPLIFIED POSITIVE-TYPE PHOTOSENSITIVE RESIN COMPOSITION AND METHOD FOR PRODUCING RESIST PATTERN USING THE SAME

(71) Applicant: Tokyo Ohka Kogyo Co., Ltd., Kawasaki-shi (JP)

(72) Inventor: Makiko Irie, Kawasaki (JP)

(73) Assignee: TOKYO OHKA KOGYO CO., LTD, Kawasaki-Shi (JP)

(*) Notice: Subject to any disclaimer, the term of this patent is extended or adjusted under 35 U.S.C. 154(b) by 0 days.

(21) Appl. No.: 14/459,742

(22) Filed: Aug. 14, 2014

(65) Prior Publication Data

US 2015/0056557 A1    Feb. 26, 2015

(30) Foreign Application Priority Data

Aug. 23, 2013    (JP) .................... 2013-173960

(51) Int. Cl.
| G03F 7/004 | (2006.01) |
| G03F 7/40 | (2006.01) |
| G03F 7/039 | (2006.01) |
| G03F 7/30 | (2006.01) |
| G03F 7/027 | (2006.01) |

(52) U.S. Cl.
CPC .............. *G03F 7/0397* (2013.01); *G03F 7/027* (2013.01); *G03F 7/30* (2013.01)

(58) Field of Classification Search
None
See application file for complete search history.

(56) References Cited

U.S. PATENT DOCUMENTS

| 5,310,619 | A | * | 5/1994 | Crivello | ............... | G03F 7/0045 |
| | | | | | | 430/270.1 |
| 5,693,452 | A | * | 12/1997 | Aoai | .................... | G03F 7/0045 |
| | | | | | | 430/176 |
| 6,165,680 | A | * | 12/2000 | Choi | ........................ | 430/270.1 |
| 6,641,974 | B2 | * | 11/2003 | Kim et al. | ................. | 430/270.1 |
| 6,815,143 | B2 | * | 11/2004 | Watanabe | ............ | G03F 7/0045 |
| | | | | | | 430/270.1 |
| 7,211,367 | B2 | * | 5/2007 | Kobayashi | .......... | C07D 327/06 |
| | | | | | | 430/270.1 |
| 7,511,169 | B2 | * | 3/2009 | Ohsawa et al. | ................ | 562/30 |
| 2005/0175935 | A1 | * | 8/2005 | Harada et al. | ............. | 430/270.1 |
| 2012/0184100 | A1 | | 7/2012 | Yasuda et al. | | |
| 2013/0004739 | A1 | * | 1/2013 | Odani | .................... | G03F 7/203 |
| | | | | | | 428/195.1 |

FOREIGN PATENT DOCUMENTS

| JP | 03-253858 | * | 11/1991 |
| JP | 04-037760 | * | 2/1992 |
| JP | 06-043653 | * | 2/1994 |
| JP | 09-068803 | * | 3/1997 |
| JP | 11-029528 | * | 2/1999 |
| JP | 2002-251011 | * | 9/2002 |
| JP | 2002-258483 | * | 9/2002 |
| JP | 2002-278071 | * | 9/2002 |
| JP | 2002-296779 | * | 10/2002 |
| JP | 2003-177539 | * | 6/2003 |
| JP | 2010-020204 | * | 1/2012 |
| JP | 2012-163949 | | 8/2012 |

* cited by examiner

*Primary Examiner* — Martin Angebranndt
(74) *Attorney, Agent, or Firm* — Knobbe Martens Olson and Bear, LLP

(57) ABSTRACT

A chemically amplified positive-type photosensitive resin composition including a compound represented by the following formula (1), having a melting point of 40° C. or lower at 1 atm, a resin whose solubility in alkali increases under the action of an acid, and a photoacid generator. In the formula, $R^1$ represents a hydrogen atom or an organic group; and $R^2$, $R^3$, and $R^4$ independently represent a monovalent hydrocarbon group which may have a substituent, and at least two of $R^2$, $R^3$, and $R^4$ may be bonded to each other to form a cyclic structure.

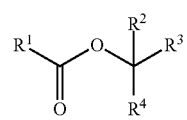

(1)

4 Claims, No Drawings

CHEMICALLY AMPLIFIED POSITIVE-TYPE PHOTOSENSITIVE RESIN COMPOSITION AND METHOD FOR PRODUCING RESIST PATTERN USING THE SAME

CROSS-REFERENCE TO RELATED APPLICATIONS

The present application claims priority under 35 U.S.C. §119(a)-(d) to Japanese Patent Application No. 2013-173960, filed Aug. 23, 2013, the content of which is incorporated herein by reference.

BACKGROUND OF THE INVENTION

1. Field of the Invention

The present invention relates to a chemically amplified positive-type photosensitive resin composition and a method for producing a resist pattern, using the chemically amplified positive-type photosensitive resin composition.

2. Background Art

In recent years, high density packaging technologies have progressed in semiconductor packages along with a downsizing of electronic devices, and the increase in package density has been developed on the basis of mounting multi-pin thin films in packages, miniaturization of package sizes, two-dimensional packaging technologies in flip-tip systems or three-dimensional packaging technologies. In these types of high density packaging techniques, connecting terminals, including protruding electrodes (mounting terminals) such as bumps that protrude above a package, or metal posts or the like that extend from peripheral terminals on a wafer and connect with rewiring to the mounting terminals, are disposed on the surface of the substrate with high precision.

As a method of forming protruding electrodes or metal posts as described above, a method, in which a film having a large film thickness is formed on a surface to be processed of a substrate by spin coating, then predetermined portions in the film are selectively removed to pattern the film, a conductor such as copper is embedded in a portion after having the film portion removed in the film by plating, and then the surrounding film is removed, has been known. As a composition for forming such a film having a large film thickness on a substrate, a chemically amplified photosensitive resin composition including at least a resin whose solubility in alkali increases under the action of an acid and an acid generator has been known (see, for example, Japanese Unexamined Patent Application, Publication No. 2012-163949).

SUMMARY OF THE INVENTION

In order to form protruding electrodes or metal posts with high precision, a chemically amplified photosensitive resin composition is required to have excellent contrast and high sensitivity, thus to obtain a resist pattern having high rectangularity at a smaller exposure dose.

The present invention has been made taking this situation into consideration, and has an object to provide a chemically amplified positive-type photosensitive resin composition having excellent contrast and high sensitivity, and a method for producing a resist pattern using the same.

The present inventors have conducted intensive studies in order to achieve the object, and as a result, the present inventors have found that the problems described above can be solved by adding a predetermined monocarboxylic acid ester compound having a melting point of 40° C. or lower at 1 atm to a chemically amplified positive-type photosensitive resin composition, thereby completing the present invention. Specifically, the present invention provides the following.

A first aspect of the present invention is a chemically amplified positive-type photosensitive resin composition containing a compound represented by the following formula (1), having a melting point of 40° C. or lower at 1 atm, a resin whose solubility in alkali increases under the action of an acid, and a photoacid generator.

[Chemical formula 1]

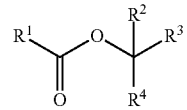

(1)

In the formula, $R^1$ represents a hydrogen atom or an organic group. $R^2$, $R^3$, and $R^4$ independently represent a monovalent hydrocarbon group which may have a substituent. At least two of $R^2$, $R^3$, and $R^4$ may be bonded to each other to form a cyclic structure.

A second aspect of the present invention is a method for producing a resist pattern, including a photosensitive resin layer-forming step of forming a photosensitive resin layer containing the chemically amplified positive-type photosensitive resin composition on a substrate; an exposure step of selectively exposing the photosensitive resin layer; and a developing step of developing the exposed photosensitive resin layer.

According to the present invention, a chemically amplified positive-type photosensitive resin composition having an excellent contrast and high sensitivity, and a method for producing a resist pattern using the same can be provided.

DETAILED DESCRIPTION OF THE INVENTION

Chemically Amplified Positive-type Photosensitive Resin Composition

The chemically amplified positive-type photosensitive resin composition according to the present invention contains at least a compound (A) represented by the formula (1), having a melting point of 40° C. or lower at 1 atm (hereinafter also referred to as a "component (A)"), a resin whose solubility in alkali increases under the action of an acid (B) (hereinafter also referred to as a "component (B)"), and a photoacid generator (C) (hereinafter also referred to as a "component (C)"). This chemically amplified positive-type photosensitive resin composition is suitably used in the formation of connecting terminals such as bumps and metal posts in the production of circuit boards and the production of electronic components such as CSPs (chip-size packages) that are mounted on the circuit boards, and the formation of a wiring pattern and the like.

The chemically amplified positive-type photosensitive resin composition according to the present invention is alkali-insoluble before exposure, but if acids are generated from the component (C) by exposure, the acid-dissociative dissolution-controlling groups in the component (B) are dissociated under the action of an acid, and the chemically amplified positive-type photosensitive resin composition is changed to be alkali-soluble. As a result, in the production of a resist pattern, if a photosensitive resin layer obtained by coating the chemically amplified positive-type photosensitive resin composition on a substrate is selectively exposed, an exposed area is changed to be alkali-soluble, while an unexposed area is not changed and is still alkali-insoluble, thereby being developed in alkali.

Compound (A) Represented by Formula (1), Having Melting Point of 40° C. or Lower at 1 atm The chemically amplified positive-type photosensitive resin composition according to the present invention contains a compound (A) represented by the formula (1), having a melting point of 40° C. or lower at 1 atm. The component (A) is usually liquid at room temperature and 1 atm, and is thus used as a solvent. The components (A) may be used singly or in combination of two or more kinds thereof.

The component (A) has an acid-dissociative group, and when this acid-dissociative group is dissociated under the action of an acid, monocarboxylic acids are produced. Accordingly, in the photosensitive resin layer containing the chemically amplified positive-type photosensitive resin composition according to the present invention, if an acid is generated from the component (C) by exposure, the acid-dissociative dissolution-controlling group in the component (B) is dissociated under the action of this acid. Thus, the solubility of the component (B) in an alkali is increased, a monocarboxylic acid is also produced from the component (A) under the action of the acid, and the dissociation of this acid-dissociative dissolution-controlling group in the component (B) is further promoted by the monocarboxylic acid. Therefore, a resist pattern having high rectangularity can be obtained from the chemically amplified positive-type photosensitive resin composition according to the present invention at a smaller exposure dose. In this manner, the chemically amplified positive-type photosensitive resin composition according to the present invention has an excellent contrast and high sensitivity by incorporating the component (A) thereinto. Generally, as the film thickness of the photosensitive resin layer is greater, the amount of the solvent remaining in the photosensitive resin layer even after prebaking is increased, and accordingly, the above effect when the component (A) is incorporated is easily obtained, in particular, in the case where the chemically amplified positive-type photosensitive resin composition according to the present invention is used for the formation of a resist pattern of a thick film.

The melting point of the component (A) at 1 atm is usually 40° C. or lower, and preferably 15° C. to 40° C. If the melting point is 40° C. or lower, the component (A) is usually liquid and can thus be used as a solvent for dissolving other components, at room temperature and 1 atm, which are general conditions to carryout the preparation or coating of the chemically amplified positive-type photosensitive resin composition according to the present invention.

The boiling point of the component (A) at 1 atm is preferably 100° C. or higher, and more preferably 120° C. or higher. If the boiling point is within the above range, the component (A) easily remains in the chemically amplified positive-type photosensitive resin composition at a higher ratio even after prebaking, and thus, the chemically amplified positive-type photosensitive resin composition is more likely to have more excellent contrast and higher sensitivity.

In the formula (1), the organic group represented by $R^1$ may be linear, branched, or cyclic, and examples of the organic group include a monovalent hydrocarbon group which may have a substituent. Examples of the monovalent hydrocarbon group include an alkyl group, a cycloalkyl group, an alkenyl group, a cycloalkenyl group, an aryl group, and an aralkyl group. Examples of the substituent include halogen atoms (a fluorine atom, a chlorine atom, a bromine atom, an iodine atom, and the like), a hydroxyl group, and monovalent hydrocarbon groups (an alkyl group, a cycloalkyl group, an alkenyl group, a cycloalkenyl group, an aryl group, an aralkyl group, and the like). Specific examples of the organic group represented by $R^1$ include an alkyl group having 1 to 20 carbon atoms, and preferably 1 to 6 carbon atoms, such as a methyl group, an ethyl group, a propyl group, an isopropyl group, a butyl group, an isobutyl group, a sec-butyl group, a tert-butyl group, a pentyl group, a hexyl group, an octyl group, a decyl group, a dodecyl group, an octadecyl group, and an eicosyl group; an cycloalkyl group having 3 to 20 carbon atoms, and preferably 3 to 6 carbon atoms, such as a cyclopentyl group and a cyclohexyl group; an alkenyl group having 2 to 20 carbon atoms, and preferably 2 to 6 carbon atoms, such as a vinyl group and an allyl group; an cycloalkenyl group having 3 to 20 carbon atoms, and preferably 3 to 6 carbon atoms, such as a cyclopentenyl group and a cyclohexenyl group; an aryl group having 6 to 20 carbon atoms, and preferably 6 to 12 carbon atoms, such as a phenyl group, a tolyl group, and a naphthyl group; and an aralkyl group having 7 to 20 carbon atoms, and preferably 7 to 13 carbon atoms, such as a benzyl group and a phenethyl group, and among these, a methyl group and a phenyl group are preferred.

Furthermore, examples of $R^2$, $R^3$, and $R^4$ include an alkyl group, a cycloalkyl group, an alkenyl group, a cycloalkenyl group, an aryl group, and an aralkyl group. Examples of the substituent, which the monovalent hydrocarbon groups represented by $R^2$, $R^3$, and $R^4$ may have include those exemplified in the description of $R^1$. Further, specific examples of $R^2$, $R^3$, and $R^4$ include the same groups as the specific examples of the organic group represented by $R^1$, and a cycloalkenyl group having 3 to 20 carbon atoms, and preferably 3 to 6 carbon atoms, which is substituted with an alkyl group having 1 to 20 carbon atoms, and preferably 1 to 6 carbon atoms, such as a 4-methyl-3-cyclohexenyl group, and among these, a methyl group, a benzyl group, and a 4-methyl-3-cyclohexenyl group are preferred.

At least two of $R^2$, $R^3$, and $R^4$ may be bonded to each other to form a cyclic structure, and the cyclic structure may contain a hetero atom such as an oxygen atom and a nitrogen atom. Examples of the cyclic structure include a cycloalkane ring and an arene ring, and the cyclic structure may be a condensed ring.

Specific examples of the compound represented by the formula (1) include compounds represented by the following formulae.

[Chemical formula 2]

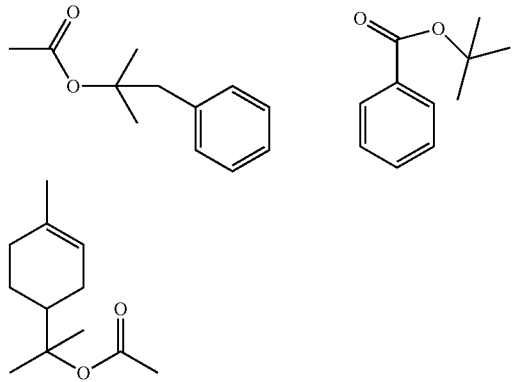

The content of the component (A) is preferably in the range of 5 parts by mass to 100 parts by mass, and more preferably in the range of 10 parts by mass to 30 parts by mass, with respect to 100 parts by mass of the resin solid content (in particular, the component (B) as described later, or in the case where the chemically amplified positive-type photosensitive resin composition contains the component (D) as described later, a combination of the component (B) and the component (D)). Within the range above, the chemically amplified positive-type photosensitive resin composition is likely to have an excellent contrast and high sensitivity.

Resin Whose Solubility in Alkali Increases Under Action of Acid (B)

The resin whose solubility in alkali increases under the action of an acid (B) can be selected from various resins which have been blended in the photosensitive resin composition in the related art. The components (B) may be used singly or in combination of two or more kinds thereof. Suitable examples of the component (B) include a novolak resin (B1), a polyhydroxystyrene resin (B2), and an acrylic resin (B3), having the following specific structures. Hereinafter, the novolak resin (B1), the polyhydroxystyrene resin (B2), and the acrylic resin (B3) will be described in order.

Novolak Resin (B1)

As the novolak resin (B1), a resin containing the structural unit represented by the following formula (b1) can be used.

[Chemical formula 3]

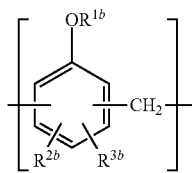

(b1)

In the formula (b1), $R^{1b}$ represents an acid-dissociative dissolution-controlling group; and $R^{2b}$ and $R^{3b}$ each independently represent a hydrogen atom or an alkyl group having 1 to 6 carbon atoms.

The acid-dissociative dissolution-controlling group represented by $R^{1b}$ is preferably a group represented by the following formula (b2) or (b3), a linear, branched, or cyclic alkyl group having 1 to 6 carbon atoms, a vinyloxyethyl group, a tetrahydropyranyl group, a tetrafuranyl group, or a trialkylsilyl group.

[Chemical formula 4]

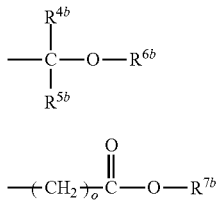

In the formulae (b2) and (b3), $R^{4b}$ and $R^{5b}$ each independently represent a hydrogen atom, or a linear or branched alkyl group having 1 to 6 carbon atoms; $R^{6b}$ represents a linear, branched, or cyclic alkyl group having 1 to 10 carbon atoms; $R^{7b}$ represents a linear, branched, or cyclic alkyl group having 1 to 6 carbon atoms; and o represents 0 or 1.

Examples of the linear or branched alkyl group include a methyl group, an ethyl group, a propyl group, an isopropyl group, an n-butyl group, an isobutyl group, a tert-butyl group, a pentyl group, an isopentyl group, and a neopentyl group.

Also, examples of the cyclic alkyl group include a cyclopentyl group and a cyclohexyl group.

Here, specific examples of the acid-dissociative dissolution-controlling group represented by the formula (b2) include a methoxyethyl group, an ethoxyethyl group, an n-propoxyethyl group, an isopropoxyethyl group, an n-butoxyethyl group, an isobutoxyethyl group, a tert-butoxyethyl group, a cyclohexyloxyethyl group, a methoxypropyl group, an ethoxypropyl group, a 1-methoxy-1-methyl-ethyl group, and a 1-ethoxy-1-methylethyl group. Further, specific examples of the acid-dissociative dissolution-controlling group represented by the formula (b3) include a tert-butoxycarbonyl group and a tert-butoxycarbonylmethyl group. Examples of the trialkylsilyl group include a trimethylsilyl group and a tri-tert-butyldimethylsilyl group, in which each alkyl group has 1 to 6 carbon atoms.

Polyhydroxystyrene Resin (B2)

As the polyhydroxystyrene resin (B2), a resin containing the structural unit represented by the following formula (b4) can be used.

[Chemical formula 5]

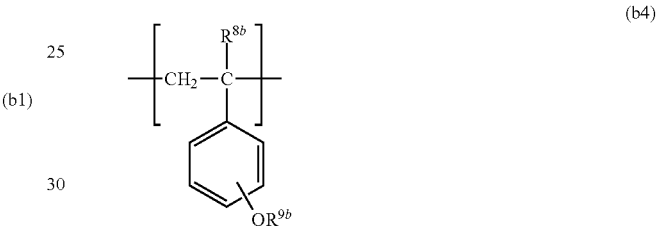

(b4)

In the formula (b4), $R^{8b}$ represents a hydrogen atom or an alkyl group having 1 to 6 carbon atoms; and $R^{9b}$ represents an acid-dissociative dissolution-controlling group.

The alkyl group having 1 to 6 carbon atoms may include, for example, linear, branched, or cyclic alkyl groups having 1 to 6 carbon atoms. Examples of the linear or branched alkyl group include a methyl group, an ethyl group, a propyl group, an isopropyl group, an n-butyl group, an isobutyl group, a tert-butyl group, a pentyl group, an isopentyl group, and a neopentyl group; and examples of the cyclic alkyl group include a cyclopentyl group and a cyclohexyl group.

The acid-dissociative dissolution-controlling group represented by $R^{9b}$ may be similar to the acid-dissociative dissolution-controlling groups exemplified in terms of the formulae (b2) and (b3).

Furthermore, the polyhydroxystyrene resin (B2) may include another polymerizable compound as a structural unit in order to moderately control physical or chemical properties. Examples of the polymerizable compound include conventional radical polymerizable compounds and anion polymerizable compounds. Examples of the polymerizable compound include monocarboxylic acids such as acrylic acid, methacrylic acid, and crotonic acid; dicarboxylic acids such as maleic acid, fumaric acid, and itaconic acid; methacrylic acid derivatives having a carboxyl group and an ester bond, such as 2-methacryloyloxyethyl succinic acid, 2-methacryloyloxyethyl maleic acid, 2-methacryloyloxyethyl phthalic acid, and 2-methacryloyloxyethyl hexahydrophthalic acid; alkyl(meth)acrylic esters such as methyl(meth)acrylate, ethyl(meth)acrylate, and butyl(meth)acrylate; hydroxyalkyl(meth)acrylic esters such as 2-hydroxyethyl (meth)acrylate and 2-hydroxypropyl(meth)acrylate; aryl (meth)acrylic esters such as phenyl(meth)acrylate and benzyl (meth)acrylate; dicarboxylic diesters such as diethyl maleate and dibutyl fumarate; vinyl group-containing aromatic compounds such as styrene, α-methylstyrene, chlorostyrene, chloromethylstyrene, vinyltoluene, hydroxystyrene, α-methylhydroxystyrene, and α-ethylhydroxystyrene; vinyl group-containing aliphatic compounds such as vinyl acetate; conjugated diolefins such as butadiene and isoprene; nitrile group-containing polymerizable compounds such as acrylonitrile and methacrylonitrile; chlorine-containing polymerizable compounds such as vinyl chloride and vinylidene chloride; and amide bond-containing polymerizable compounds such as acrylamide and methacrylamide.

Acrylic Resin (B3)

As the acrylic resin (B3), resins including structural units represented by the following formulae (b5) to (b7) can be used.

[Chemical formula 6]

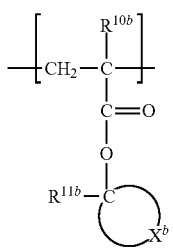
(b5)

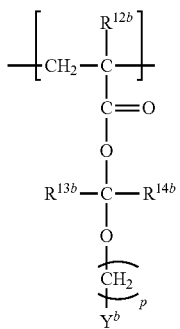
(b6)

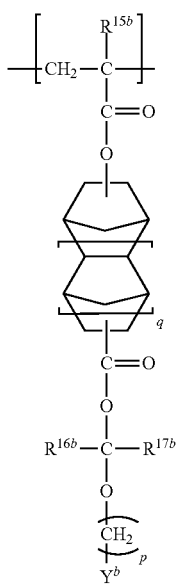
(b7)

In the formulae (b5) to (b7), $R^{10b}$ to $R^{17b}$ each independently represent a hydrogen atom, a linear or branched alkyl group having 1 to 6 carbon atoms, a fluorine atom, or a linear or branched fluorinated alkyl group having 1 to 6 carbon atoms (provided that $R^{11b}$ is not a hydrogen atom); $X^b$ forms a hydrocarbon ring having 5 to 20 carbon atoms together with a carbon atom to which $X^b$ is bonded; $Y^b$ represents an alicyclic group or an alkyl group that may have a substituent; p represents an integer of 0 to 4; and q represents 0 or 1.

Moreover, examples of the linear or branched alkyl group include a methyl group, an ethyl group, a propyl group, an isopropyl group, an n-butyl group, an isobutyl group, a tert-butyl group, a pentyl group, an isopentyl group, and a neopentyl group. Further, the fluorinated alkyl group refers to the alkyl groups of which the hydrogen atoms are partially or entirely substituted with fluorine atoms.

$R^{11b}$ is preferably a linear or branched alkyl group having 2 to 4 carbon atoms in view of good contrast, resolution, depth and width of focus, or the like; and $R^{13b}$, $R^{14b}$, $R^{16b}$, and $R^{17b}$ are each preferably a hydrogen atom or a methyl group.

$X^b$ forms an alicyclic group having 5 to 20 carbon atoms together with a carbon atom to which $X^b$ is bonded. Specific examples of the alicyclic group are the groups of monocycloalkanes and polycycloalkanes such as bicycloalkanes, tricycloalkanes, and tetracycloalkanes, from which at least one hydrogen atom is removed. Specific examples thereof are monocycloalkanes such as cyclopentane, cyclohexane, cycloheptane, and cyclooctane, and polycycloalkanes such as adamantane, norbornane, isobornane, tricyclodecane, and tetracyclododecane, from which at least one hydrogen atom is removed. Particularly preferable are cyclohexane and adamantane from which at least one hydrogen atom is removed (that may further have a substituent).

When the alicyclic group of $X^b$ has a substituent on the ring skeleton, examples of the substituent include polar groups such as a hydroxyl group, a carboxyl group, a cyano group, and an oxygen atom (=O), and linear or branched alkyl groups having 1 to 4 carbon atoms. The polar group is particularly preferably an oxygen atom (=O).

$Y^b$ is an alicyclic group or an alkyl group; and examples thereof are monocycloalkanes and polycycloalkanes such as bicycloalkanes, tricycloalkanes, and tetracycloalkanes, from which at least one hydrogen atom is removed. Specific examples thereof include monocycloalkanes such as cyclopentane, cyclohexane, cycloheptane, and cyclooctane, and polycycloalkanes such as adamantane, norbornane, isobornane, tricyclodecane, and tetracyclododecane, from which at least one hydrogen atom is removed. Particularly preferred is adamantane from which at least one hydrogen atom is removed (which may further have a substituent).

Moreover, when the alicyclic group of $Y^b$ has a substituent on the ring skeleton, examples of the substituent include polar groups such as a hydroxyl group, a carboxyl group, a cyano group, and an oxygen atom (=O), and linear or branched alkyl groups having 1 to 4 carbon atoms. The polar group is preferably an oxygen atom (=O) in particular.

Furthermore, when $Y^b$ is an alkyl group, it is preferably a linear or branched alkyl group having 1 to 20 carbon atoms, and more preferably 6 to 15 carbon atoms. Preferably, the alkyl group is an alkoxyalkyl group in particular; and examples of the alkoxyalkyl group include a 1-methoxyethyl group, a 1-ethoxyethyl group, a 1-n-propoxyethyl group, a 1-isopropoxyethyl group, a 1-n-butoxyethyl group, a 1-isobutoxyethyl group, a 1-tert-butoxyethyl group, a 1-methoxypropyl group, a 1-ethoxypropyl group, a 1-methoxy-1-methylethyl group, and a 1-ethoxy-1-methylethyl group.

Preferable specific examples of the structural unit represented by the formula (b5) are those represented by the following formulae (b5-1) to (b5-33).

[Chemical formula 7]
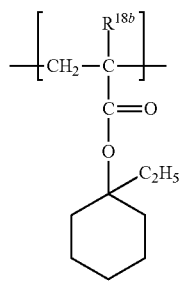
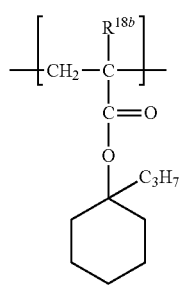
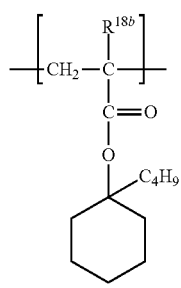
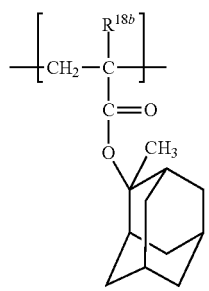
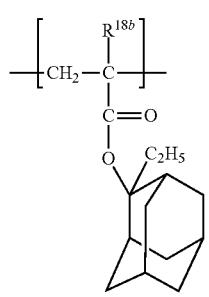
(b5-1)
(b5-2)
(b5-3)
(b5-4)
(b5-5)
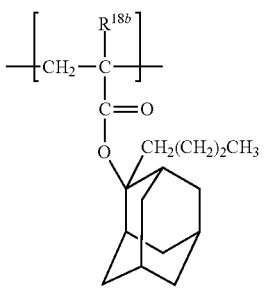
(b5-6)
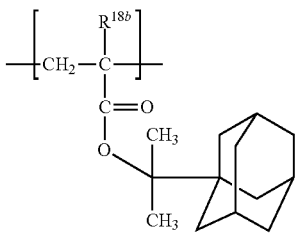
(b5-7)
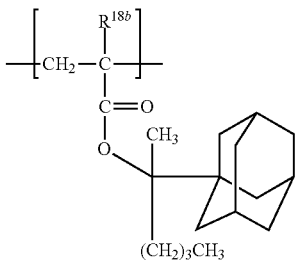
(b5-8)
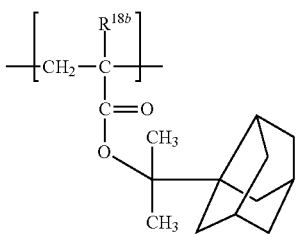
(b5-9)
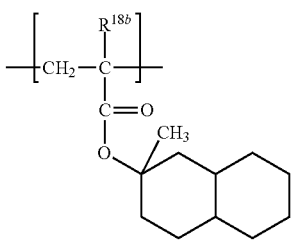
(b5-10)
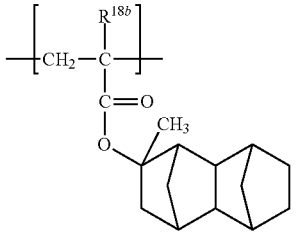
(b5-11)

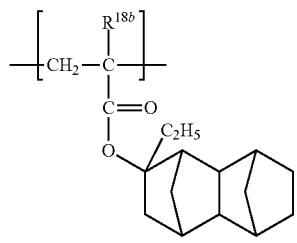
(b5-12)
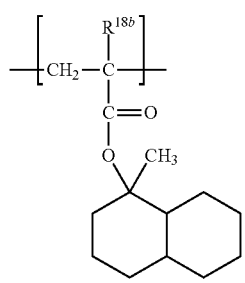
(b5-13)
[Chemical formula 8]
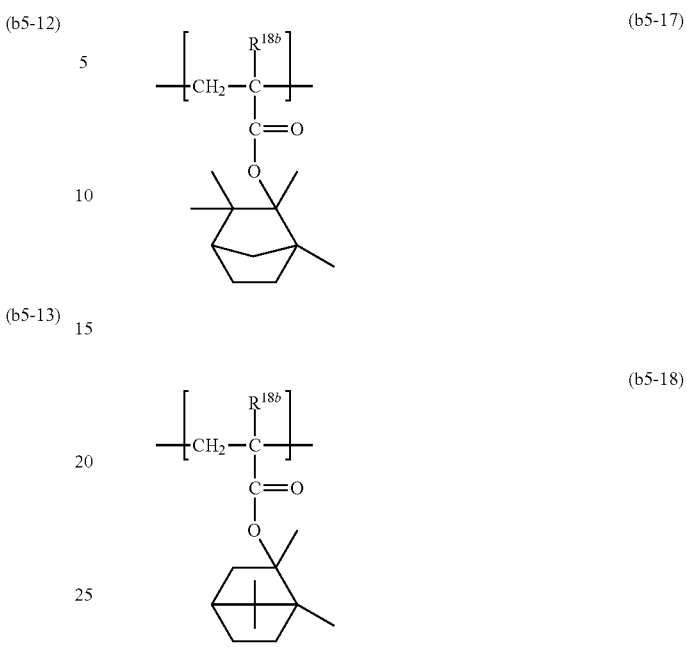
(b5-14)
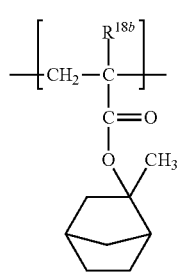
(b5-15)
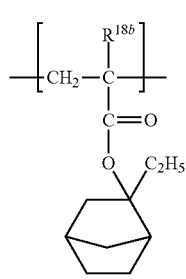
(b5-16)
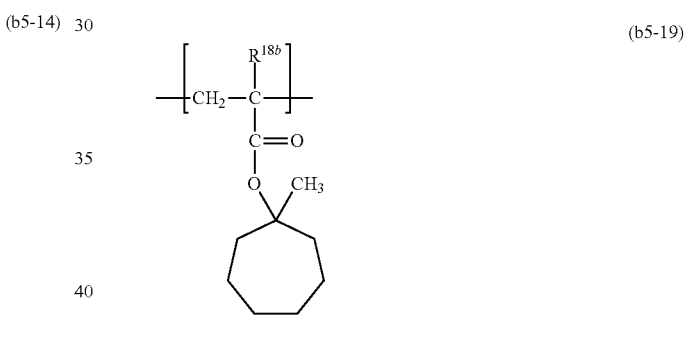
(b5-17)
(b5-18)
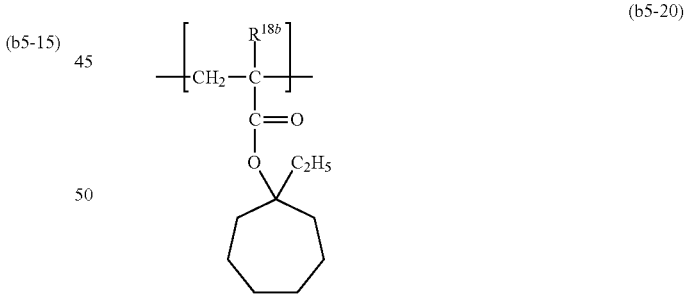
(b5-19)
(b5-20)
(b5-21)

(b5-22) 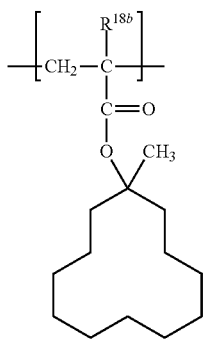
(b5-23) 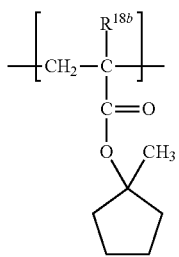
[Chemical formula 9]
(b5-24) 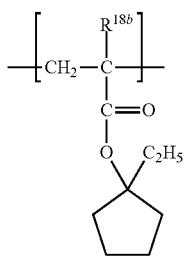
(b5-25) 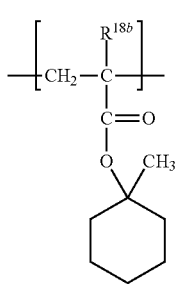
(b5-26) 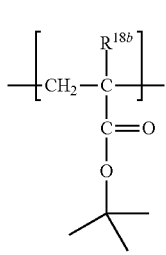
(b5-27) 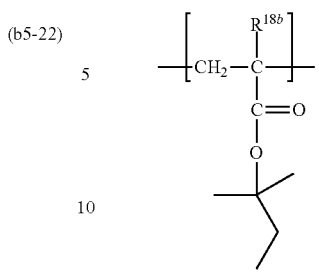
(b5-28) 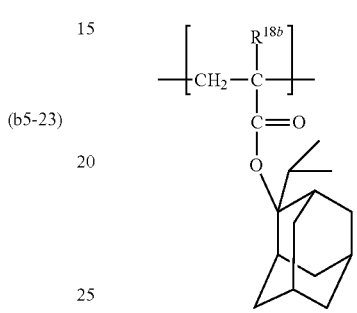
(b5-29) 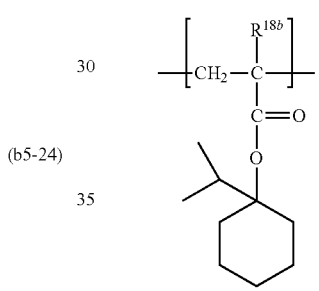
(b5-30) 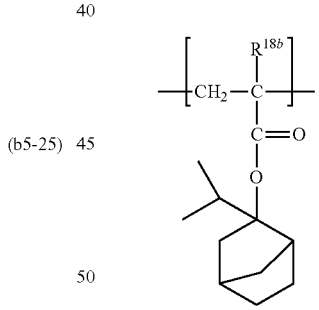
(b5-31) 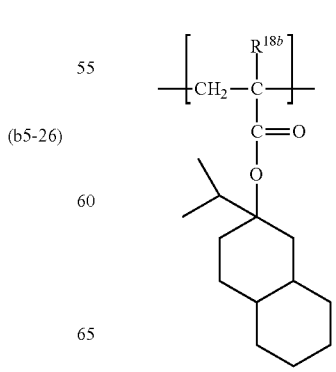

(b5-32)
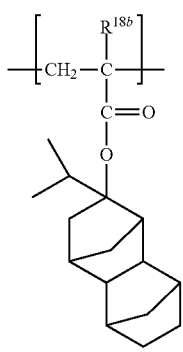
(b5-33)
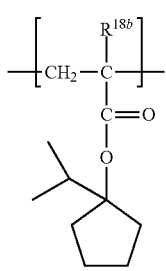
In the formulae (b5-1) to (b5-33), $R^{18b}$ represents a hydrogen atom or a methyl group.
Preferable specific examples of the structural unit represented by the formula (b6) include those represented by the following formulae (b6-1) to (b6-24).
[Chemical formula 10]
(b6-1)
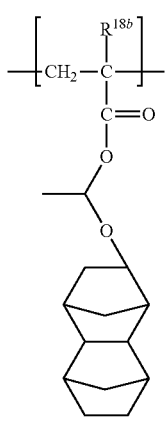
(b6-2)
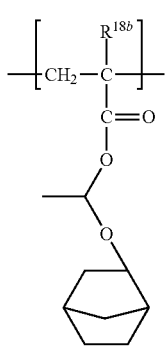
(b6-3)
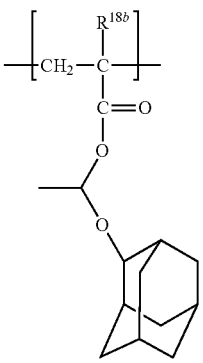
(b6-4)
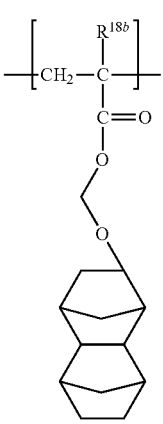
(b6-5)
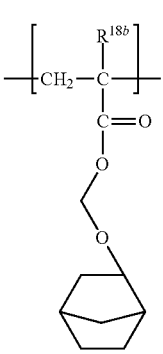
(b6-6)
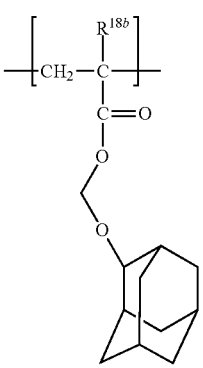

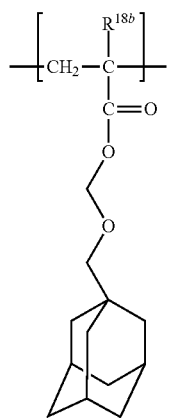
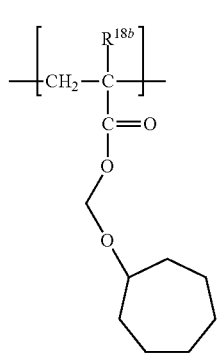
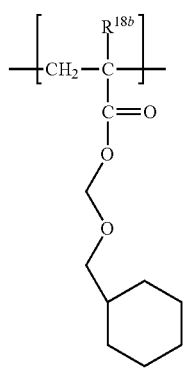
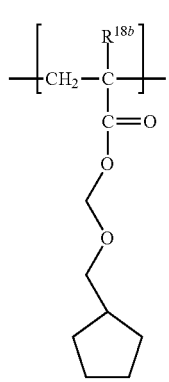
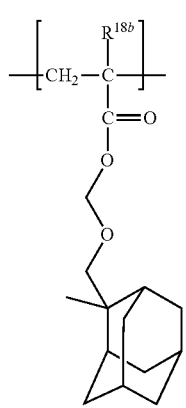

(b6-15) 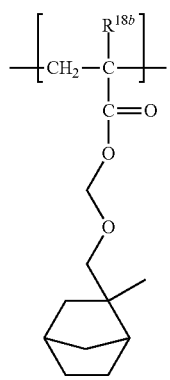
[Chemical formula 11]
(b6-16) 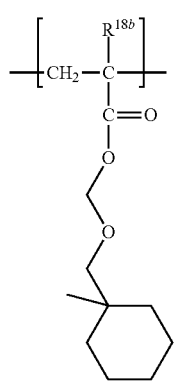
(b6-17) 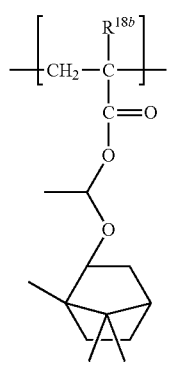
(b6-18) 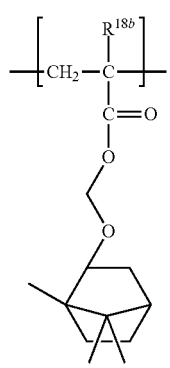
(b6-19) 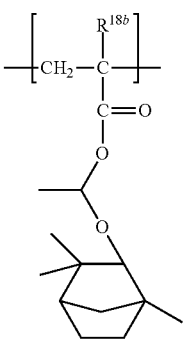
(b6-20) 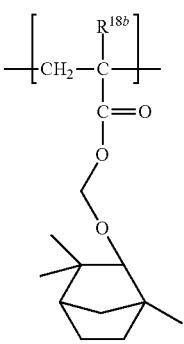
(b6-21) 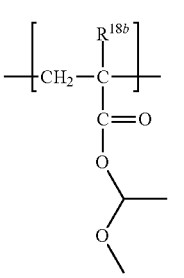
(b6-22)
(b6-23) 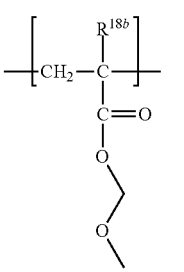

(b6-24) 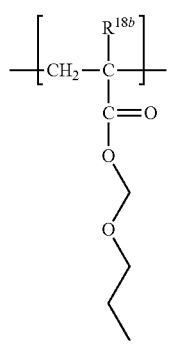
In the formulae (b6-1) to (b6-24), $R^{18b}$ represents a hydrogen atom or a methyl group.
Preferable specific examples of the structural unit represented by the formula (b7) include those represented by the following formulae (b7-1) to (b7-15).
[Chemical formula 12]
(b7-1) 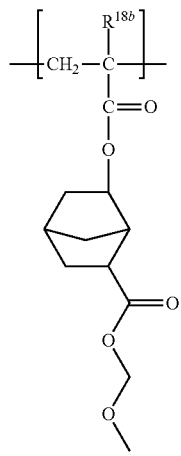
(b7-2) 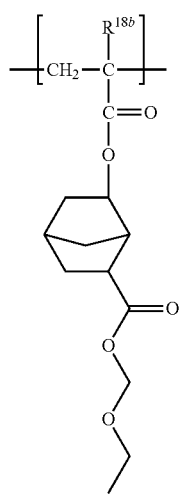
(b7-3) 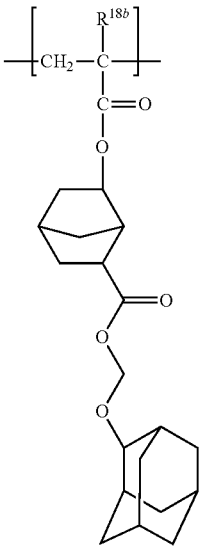
(b7-4) 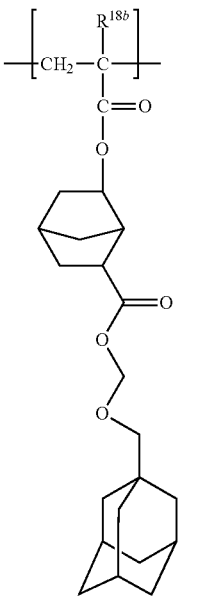
(b7-5) 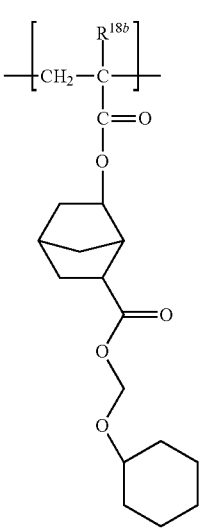

(b7-6)
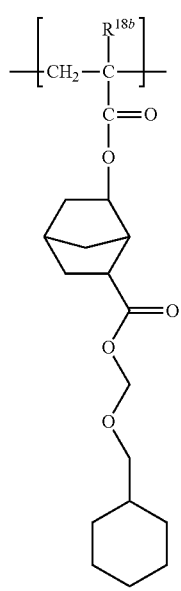
(b7-8)
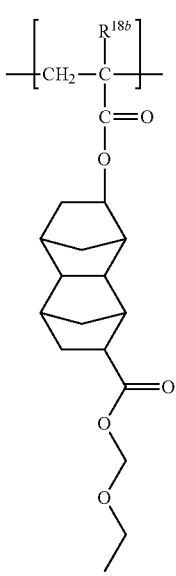
(b7-7)
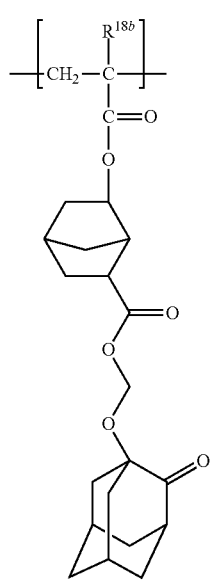
(b7-9)
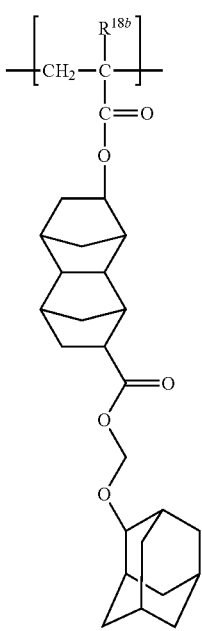

(b7-10)
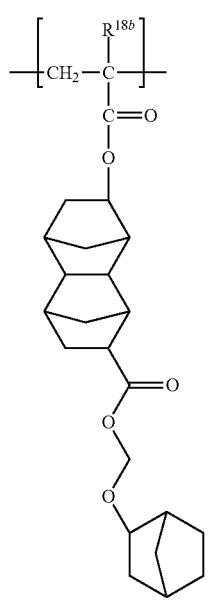
[Chemical formula 13]
(b7-11)
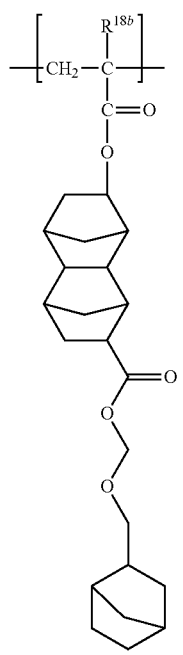
(b7-12)
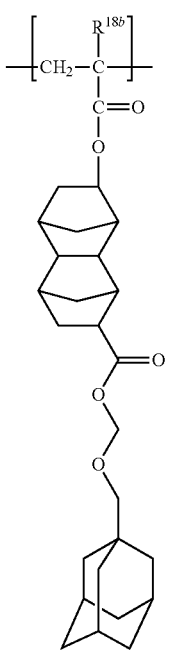
(b7-13)
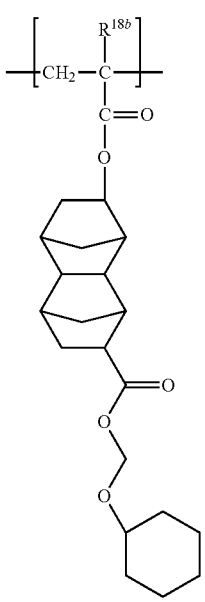

-continued

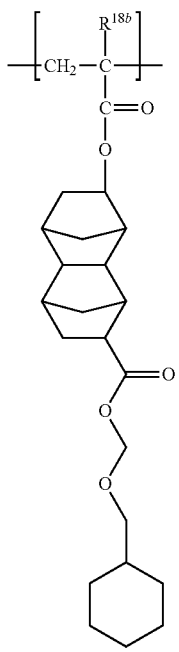

(b7-14)

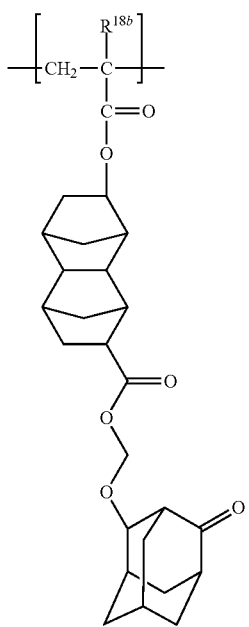

(b7-15)

In the formulae (b7-1) to (b7-15), $R^{18b}$ represents a hydrogen atom or a methyl group.

The acrylic resin (B3) is preferably a copolymer containing a structural unit derived from a polymerizable compound having an ether bond in addition to the structural units represented by the formulae (b5) to (b7).

Examples of the polymerizable compound having an ether bond include radical polymerizable compounds such as (meth)acrylic acid derivatives having an ether bond and an ester bond, and specific examples thereof include 2-methoxyethyl(meth)acrylate, 2-ethoxyethyl(meth)acrylate, methoxytriethylene glycol(meth)acrylate, 3-methoxybutyl(meth)acrylate, ethylcarbitol(meth)acrylate, phenoxypolyethylene glycol(meth)acrylate, methoxypolyethylene glycol(meth)acrylate, methoxypolypropylene glycol(meth)acrylate, and tetrahydrofurfuryl(meth)acrylate. Also, the polymerizable compound having an ether bond is preferably 2-methoxyethyl(meth)acrylate, 2-ethoxyethyl(meth)acrylate, or methoxytriethylene glycol(meth)acrylate. These polymerizable compounds may be used alone or in combination of two or more kinds thereof.

Furthermore, the acrylic resin (B3) is preferably a copolymer containing a structural unit selected from structural units represented by the formulae (b5) to (b7) and a structural unit derived from a C3 to C12 linear alkyl ester of a (meth)acrylic acid. In the case where the acrylic resin (B3) contains such a unit, generation of bubbles in the film thus formed is easily suppressed.

Preferred specific examples of the C3 to C12 linear alkyl ester of a (meth)acrylic acid may include n-butyl(meth)acrylate, n-octyl(meth)acrylate, and n-decyl(meth)acrylate.

Furthermore, the acrylic resin (B3) may contain another polymerizable compound as a structural unit in order to moderately control physical or chemical properties. Examples of the polymerizable compound include conventional radical polymerizable compounds and anion polymerizable compounds.

Examples of the polymerizable compound include monocarboxylic acids such as acrylic acid, methacrylic acid and crotonic acid; dicarboxylic acids such as maleic acid, fumaric acid and itaconic acid; methacrylic acid derivatives having a carboxyl group and an ester bond such as 2-methacryloyloxyethyl succinic acid, 2-methacryloyloxyethyl maleic acid, 2-methacryloyloxyethyl phthalic acid and 2-methacryloyloxyethyl hexahydrophthalic acid; hydroxyalkyl(meth)acrylic esters such as 2-hydroxyethyl(meth)acrylate and 2-hydroxypropyl(meth)acrylate; aryl(meth)acrylic acid esters containing an aromatic group-containing group such as phenyl(meth)acrylate and benzyl(meth)acrylate; dicarboxylic diesters such as diethyl maleate and dibutyl fumarate; vinyl group-containing aromatic compounds such as styrene, α-methylstyrene, chlorostyrene, chloromethylstyrene, vinyltoluene, hydroxystyrene, α-methylhydroxystyrene and α-ethylhydroxystyrene; vinyl group-containing aliphatic compounds such as vinyl acetate; conjugated diolefins such as butadiene and isoprene; nitrile group-containing polymerizable compounds such as acrylonitrile and methacrylonitrile; chlorine-containing polymerizable compounds such as vinyl chloride and vinylidene chloride; amide bond-containing polymerizable compounds such as acrylamide and methacrylamide.

Furthermore, examples of the polymerizable compound include (meth)acrylic esters having a non-acid-dissociative aliphatic polycyclic group, and vinyl group-containing aromatic compounds. As the non-acid-dissociative aliphatic polycyclic group, particularly, a tricyclodecanyl group, an adamantyl group, a tetracyclododecanyl group, an isobornyl group, and a norbornyl group are preferred from the viewpoint of easy industrial availability. These aliphatic polycyclic groups may have a linear or branched alkyl group having 1 to 5 carbon atoms as a substituent.

Specific examples of the (meth)acrylic esters having a non-acid-dissociative aliphatic polycyclic group include those having structures represented by the following formulae (b8-1) to (b8-5).

[Chemical formula 14]

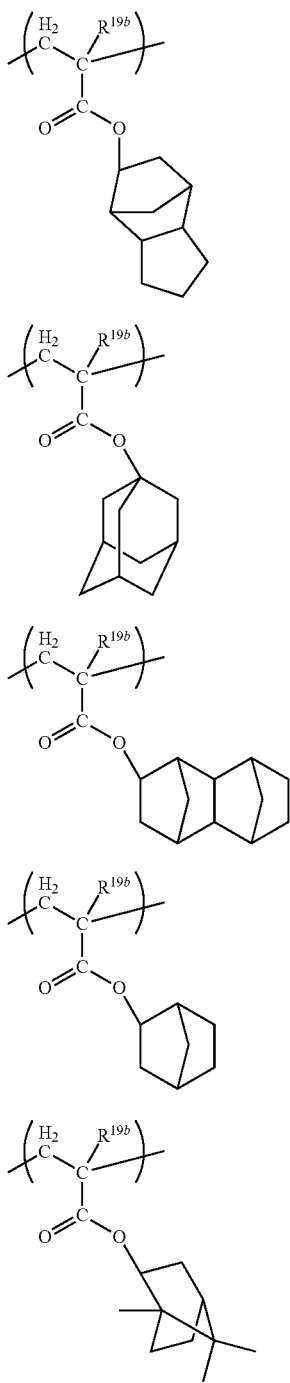

(b8-1)

(b8-2)

(b8-3)

(b8-4)

(b8-5)

In the formulae (b8-1) to (b8-5), $R^{19b}$ represents a hydrogen atom or a methyl group.

Among the components (B), acrylic resins (B3) are preferably used. Among such acrylic resins (B3), a copolymer having a structural unit represented by the formula (b5), a structural unit derived from a (meth)acrylic acid, a structural unit derived from alkyl(meth)acrylic esters, and a structural unit derived from aryl(meth)acrylic esters is preferred.

Such a copolymer is preferably a copolymer represented by the following general formula (b9).

[Chemical formula 15]

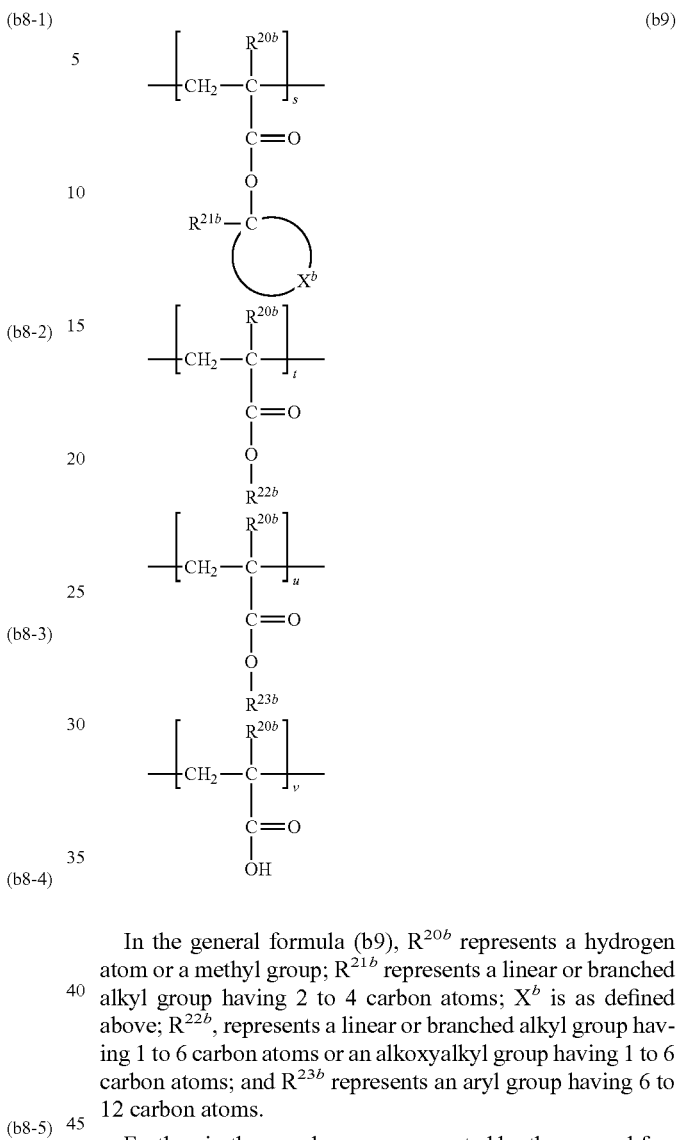

(b9)

In the general formula (b9), $R^{20b}$ represents a hydrogen atom or a methyl group; $R^{21b}$ represents a linear or branched alkyl group having 2 to 4 carbon atoms; $X^b$ is as defined above; $R^{22b}$, represents a linear or branched alkyl group having 1 to 6 carbon atoms or an alkoxyalkyl group having 1 to 6 carbon atoms; and $R^{23b}$ represents an aryl group having 6 to 12 carbon atoms.

Further, in the copolymers represented by the general formula (b9), s, t, u, and v each represent a molar ratio of the structural unit, s is 8 mol % to 45 mol %, t is 10 mol % to 65 mol %, u is 3 mol % to 25 mol %, and v is 6 mol % to 25 mol %.

The polystyrene-equivalent mass average molecular weight of the component (B) is preferably 10,000 to 600,000, more preferably 20,000 to 400,000, and even more preferably 30,000 to 300,000. By thus adjusting the mass average molecular weight, the resin layer can maintain sufficient strength without deteriorating peel properties with a substrate, and also swelling of profiles in plating, and generation of cracks can be prevented.

It is also preferable that the component (B) be a resin having a dispersivity of 1.05 or more. The dispersivity as mentioned herein indicates a value obtained by dividing a mass average molecular weight by a number average molecular weight. By adjusting the dispersivity to the range described above, problems with respect to stress resistance on intended plating or possible swelling of metal layers resulting from the plating process can be avoided.

The content of the component (B) is preferably 5% by mass to 60% by mass with respect to the total mass of the chemically amplified positive-type photosensitive resin composition.

Photoacid Generator (C)

The photoacid generator (C) used in the present invention is not particularly limited as long as it is a compound that generates an acid when irradiated with an active beam or radiation. The components (C) may be used singly or in combination of two or more kinds thereof.

As the component (C), the photoacid generators in the first to fifth aspects as described later are preferred. Hereinafter, among the components (C), suitable components will be described in the first to fifth aspects.

The first aspect in the component (C) may include a compound represented by the following formula (c1).

[Chemical formula 16]

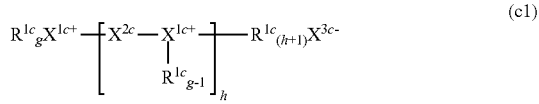
(c1)

In the formula (c1), $X^{1c}$ represents a sulfur atom having a valence of g or an iodine atom, and g represents 1 or 2. h represents the number of repeating units in the structure within parentheses. $R^{1c}$ represents an organic group that is bonded to $X^{1c}$, and represents an aryl group having 6 to 30 carbon atoms, a heterocyclic group having 4 to 30 carbon atoms, an alkyl group having 1 to 30 carbon atoms, an alkenyl group having 2 to 30 carbon atoms, or an alkynyl group having 2 to 30 carbon atoms, and $R^{1c}$ may be substituted with at least one selected from the group consisting of an alkyl group, a hydroxyl group, an alkoxy group, an alkylcarbonyl group, an arylcarbonyl group, an alkoxycarbonyl group, an aryloxycarbonyl group, an arylthiocarbonyl group, an acyloxy group, an arylthio group, an alkylthio group, an aryl group, a heterocyclic group, an aryloxy group, an alkylsulfinyl group, an arylsulfinyl group, an alkylsulfonyl group, an arylsulfonyl group, an alkyleneoxy group, an amino group, a cyano group, a nitro group, and halogen atoms. The number of $R^{1c}$s is $g+h(g-1)+1$, and $R^{1c}$s may be respectively the same as or different from each other. Further, two or more $R^{1c}$'s may be bonded to each other directly or via —O—, —S—, —SO—, —SO$_2$—, —NH—, —NR$^{2c}$—, —CO—, —COO—, —CONH—, an alkylene group having 1 to 3 carbon atoms, or a phenylene group, and may form a ring structure containing $X^{1c}$. $R^{2c}$ represents an alkyl group having 1 to 5 carbon atoms, or an aryl group having 6 to 10 carbon atoms.

$X^{2c}$ is a structure represented by the following formula (c2).

[Chemical formula 17]

(c2)

In the formula (c2), $X^{4c}$ represents an alkylene group having 1 to 8 carbon atoms, an arylene group having 6 to 20 carbon atoms, or a divalent group of a heterocyclic compound having 8 to 20 carbon atoms; $X^{4c}$ may be substituted with at least one selected from the group consisting of an alkyl group having 1 to 8 carbon atoms, an alkoxy group having 1 to 8 carbon atoms, an aryl group having 6 to 10 carbon atoms, a hydroxyl group, a cyano group, a nitro group, and a halogen atom. $X^{5c}$ represents —O—, —S—, —SO—, —SO$_2$—, —NH—, —NR$^{2c}$—, —CO—, —COO—, —CONH—, an alkylene group having 1 to 3 carbon atoms, or a phenylene group. h represents the number of repeating units of the structure in parentheses. $X^{4c}$'s in the number of h+1 and $X^{5c}$'s in the number of h may be the same as or different from each other. $R^{2c}$ has the same definition as described above.

$X^{3c-}$ represents a counterion of an onium, and examples thereof include a fluorinated alkylfluorophosphoric acid anion represented by the following formula (c17) or a borate anion represented by the following formula (c18).

[Chemical formula 18]

(c17)

In the formula (c17), $R^{3c}$ represents an alkyl group in which 80 mol % or more of the hydrogen atoms are substituted by fluorine atoms. j represents the number of $R^{3c}$s and is an integer from 1 to 5. $R^{3c}$s in the number of j may be respectively the same as or different from each other.

[Chemical formula 19]

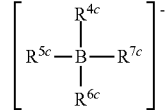
(c18)

In the formula (c18), $R^{4c}$ to $R^{7c}$ each independently represent a fluorine atom or a phenyl group, and a part or all of the hydrogen atoms of the phenyl group may be substituted by at least one selected from the group consisting of a fluorine atom and a trifluoromethyl group.

Examples of the onium ion in the compound represented by the formula (c1) include triphenylsulfonium, tri-p-tolylsulfonium, 4-(phenylthio)phenyldiphenylsulfonium, bis[4-(diphenylsulfonio)phenyl]sulfide, bis[4-{bis[4-(2-hydroxyethoxy)phenyl]sulfonio}phenyl]sulfide, bis{4-[bis(4-fluorophenyl)sulfonio]phenyl}sulfide, 4-(4-benzoyl-2-chlorophenylthio)phenylbis(4-fluorophenyl)sulfonium, 7-isopropyl-9-oxo-10-thia-9,10-dihydroanthracen-2-yldi-p-tolylsulfonium, 7-isopropyl-9-oxo-10-thia-9,10-dihydroanthracen-2-yldiphenylsulfonium, 2-[(diphenyl)sulfonio]thioxanthone, 4-[4-(4-tert-butylbenzoyl)phenylthio]phenyldi-p-tolylsulfonium, 4-(4-benzoylphenylthio)phenyldiphenylsulfonium, diphenylphenacylsulfonium, 4-hydroxyphenylmethylbenzylsulfonium, 2-naphthylmethyl(1-ethoxycarbonyl)ethylsulfonium, 4-hydroxyphenylmethylphenacylsulfonium, phenyl[4-(4-biphenylthio)phenyl]-4-biphenylsulfonium, phenyl[4-(4-biphenylthio)phenyl]-3-biphenylsulfonium, [4-(4-acetophenylthio)phenyl]diphenylsulfonium, octadecylmethylphenacylsulfonium, diphenyliodonium, di-p-tolyliodonium, bis(4-dodecylphenyl)iodonium, bis(4-methoxyphenyl)iodonium, (4-octyloxyphenyl)phenyliodonium, bis(4-decyloxy)phenyliodonium, 4-(2-hydroxytetradecyloxy)phenylphenyliodonium, 4-isopropylphenyl(p-tolyl)iodonium, and 4-isobutylphenyl(p-tolyl)iodonium.

Among the onium ions in the compound represented by formula (c1), a preferred onium ion may be a sulfonium ion represented by the following formula (c19):

[Chemical formula 20]

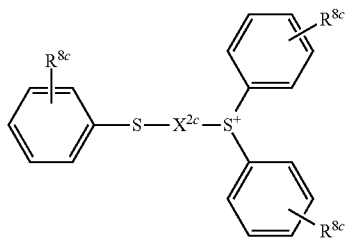

(c19)

where in the formula (c19), $R^{8c}$s each independently represent a hydrogen atom or a group selected from the group consisting of alkyl, hydroxyl, alkoxy, alkylcarbonyl, alkylcarbonyloxy, alkyloxycarbonyl, a halogen atom, an aryl which may have a substituent, and arylcarbonyl. $X^{2c}$ has the same definition as $X^{2c}$ in the formula (c1).

Specific examples of the sulfonium ion represented by the formula (c19) include 4-(phenylthio)phenyldiphenylsulfonium, 4-(4-benzoyl-2-chlorophenylthio)phenylbis(4-fluorophenyl)sulfonium, 4-(4-benzoylphenylthio)phenyldiphenylsulfonium, phenyl[4-(4-biphenylthio)phenyl]-4-biphenylsulfonium, phenyl[4-(4-biphenylthio)phenyl]-3-biphenylsulfonium, [4-(4-acetophenylthio)phenyl]diphenylsulfonium, and diphenyl[4-(p-terphenylthio)phenyl]diphenylsulfonium.

In regard to the fluorinated alkylfluorophosphoric acid anion represented by the formula (c17), $R^{3c}$ represents an alkyl group substituted with a fluorine atom, and a preferred carbon number is 1 to 8, while a more preferred carbon number is 1 to 4. Specific examples of the alkyl group include linear alkyl groups such as methyl, ethyl, propyl, butyl, pentyl and octyl; branched alkyl groups such as isopropyl, isobutyl, sec-butyl, and tert-butyl; and cycloalkyl groups such as cyclopropyl, cyclobutyl, cyclopentyl, and cyclohexyl. The proportion of hydrogen atoms substituted by fluorine atoms in the alkyl groups is usually 80 mol % or more, preferably 90 mol % or more, and even more preferably 100 mol %. If the substitution ratio of fluorine atoms is less than 80 mol %, the acid strength of the onium fluorinated alkylfluorophosphate represented by the formula (c1) decreases.

A particularly preferable example of $R^{3c}$ is a linear or branched perfluoroalkyl group having 1 to 4 carbon atoms and a substitution ratio of fluorine atoms of 100 mol %. Specific examples thereof include $CF_3$, $CF_3CF_2$, $(CF_3)_2CF$, $CF_3CF_2CF_2$, $CF_3CF_2CF_2CF_2$, $(CF_3)_2CFCF_2$, $CF_3CF_2(CF_3)CF$, and $(CF_3)_3C$. The number of $R^{3c}$s, j, represents an integer of 1 to 5, and is preferably 2 to 4, and particularly preferably 2 or 3.

Preferred specific examples of the fluorinated alkylfluorophosphoric acid anion include $[(CF_3CF_2)_2PF_4]^-$, $[(CF_3CF_2)_3PF_3]^-$, $[((CF_3)_2CF)_2PF_4]^-$, $[((CF_3)_2CF)_3PF_3]^-$, $[(CF_3CF_2CF_2)_2PF_4]^-$, $[(CF_3CF_2CF_2)_3PF_3]^-$, $[((CF_3)_2CFCF_2)_2PF_4]^-$, $[((CF_3)_2CFCF_2)_3PF_3]^-$, $[(CF_3CF_2CF_2CF_2)_2PF_4]^-$, and $[(CF_3CF_2CF_2)_3PF_3]^-$. Among these, $[(CF_3CF_2)_3PF_3]^-$, $[(CF_3CF_2CF_2)_3PF_3]^-$, $[((CF_3)_2CF)_3PF_3]^-$, $[((CF_3)_2CF)_2PF_4]^-$, $[((CF_3)_2CFCF_2)_3PF_3]^-$, and $[((CF_3)_2CFCF_2)_2PF_4]^-$ are particularly preferred.

Preferred specific examples of the borate anion represented by the formula (c18) include tetrakis(pentafluorophenyl)borate $([B(C_6F_5)_4])^-$, tetrakis[(trifluoromethyl)phenyl]borate $([B(C_6H_4CF_3)_4]^-)$, difluorobis(pentafluorophenyl)borate $([(C_6F_5)_2BF_2]^-)$, trifluoro(pentafluorophenyl)borate $([(C_6F_5)BF_3]^-)$, and tetrakis(difluorophenyl) borate $([B(C_6H_3F_2)_4]^-)$. Among these, tetrakis(pentafluorophenyl)borate $([B(C_6F_5)_4]^-)$ is particularly preferred.

The second aspect of the component (C) include halogen-containing triazine compounds such as 2,4-bis(trichloromethyl)-6-piperonyl-1,3,5-triazine, 2,4-bis(trichloromethyl)-6-[2-(2-furyl)ethenyl]-s-triazine, 2,4-bis(trichloromethyl)-6-[2-(5-methyl-2-furyl)ethenyl]-s-triazine, 2,4-bis(trichloromethyl)-6-[2-(5-ethyl-2-furyl)ethenyl]-s-triazine, 2,4-bis(trichloromethyl)-6-[2-(5-propyl-2-furyl)ethenyl]-s-triazine, 2,4-bis(trichloromethyl)-6-[2-(3,5-dimethoxyphenyl)ethenyl]-s-triazine, 2,4-bis(trichloromethyl)-6-[2-(3,5-diethoxyphenyl)ethenyl]-s-triazine, 2,4-bis(trichloromethyl)-6-[2-(3,5-dipropoxyphenyl)ethenyl]-s-triazine, 2,4-bis(trichloromethyl)-6-[2-(3-methoxy-5-ethoxyphenyl)ethenyl]-s-triazine, 2,4-bis(trichloromethyl)-6-[2-(3-methoxy-5-propoxyphenyl)ethenyl]-s-triazine, 2,4-bis(trichloromethyl)-6-[2-(3,4-methylenedioxyphenyl)ethenyl]-s-triazine, 2,4-bis(trichloromethyl)-6-(3,4-methylenedioxyphenyl)-s-triazine, 2,4-bis-trichloromethyl-6-(3-bromo-4-methoxy)phenyl-s-triazine, 2,4-bis-trichloromethyl-6-(2-bromo-4-methoxy)phenyl-s-triazine, 2,4-bis-trichloromethyl-6-(2-bromo-4-methoxy)styrylphenyl-s-triazine, 2,4-bis-trichloromethyl-6-(3-bromo-4-methoxy)styrylphenyl-s-triazine, 2-(4-methoxyphenyl)-4,6-bis(trichloromethyl)-1,3,5-triazine, 2-(4-methoxynaphthyl)-4,6-bis(trichloromethyl)-1,3,5-triazine, 2-[2-(2-furyl)ethenyl]-4,6-bis(trichloromethyl)-1,3,5-triazine, 2-[2-(5-methyl-2-furyl)ethenyl]-4,6-bis(trichloromethyl)-1,3,5-triazine, 2-[2-(3,5-dimethoxyphenyl)ethenyl]-4,6-bis(trichloromethyl)-1,3,5-triazine, 2-[2-(3,4-dimethoxyphenyl)ethenyl]-4,6-bis(trichloromethyl)-1,3,5-triazine, 2-(3,4-methylenedioxyphenyl)-4,6-bis(trichloromethyl)-1,3,5-triazine, tris(1,3-dibromopropyl)-1,3,5-triazine and tris(2,3-dibromopropyl)-1,3,5-triazine, and halogen-containing triazine compounds represented by the following formula (c3) such as tris(2,3-dibromopropyl)isocyanurate.

[Chemical formula 21]

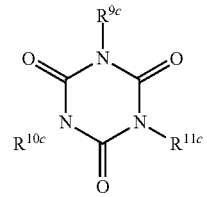

(c3)

In the formula (c3), $R^{9c}$, $R^{10c}$, and $R^{11c}$ each independently represent a halogenated alkyl group.

Further, the third aspect of the component (C) include α-(p-toluenesulfonyloxyimino)-phenylacetonitrile, α-(benzenesulfonyloxyimino)-2,4-dichlorophenylacetonitrile, α-(benzenesulfonyloxyimino)-2,6-dichlorophenylacetonitrile, α-(2-chlorobenzenesulfonyloxyimino)-4-methoxyphenylacetonitrile, α-(ethylsulfonyloxyimino)-1-cyclopentenylacetonitrile, and compounds represented by the following formula (c4) having an oximesulfonate group.

[Chemical formula 22]

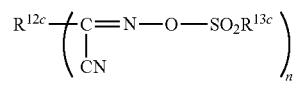

(c4)

In the formula (c4), $R^{12c}$ represents a monovalent, divalent or trivalent organic group; $R^{13c}$ represents a substituted or unsubstituted saturated hydrocarbon group, an unsaturated hydrocarbon group, or an aromatic compound group; and n represents the number of repeating units of the structure in the parentheses.

In the formula (c4), the aromatic compound group indicates a group of compounds having physical and chemical properties characteristic of aromatic compounds, and examples thereof include aryl groups such as a phenyl group and a naphthyl group, and heteroaryl groups such as a furyl group and a thienyl group. These may have one or more appropriate substituents such as a halogen atom, an alkyl group, an alkoxy group, and a nitro group on the rings. $R^{13c}$ is particularly preferably an alkyl group having 1 to 6 carbon atoms such as a methyl group, an ethyl group, a propyl group, and a butyl group. In particular, compounds in which $R^{12c}$ represents an aromatic compound group and $R^{13c}$ represents an alkyl group having 1 to 4 carbon atoms are preferred.

Examples of the acid generator represented by the formula (c4) include compounds in which $R^{12c}$ is any one of a phenyl group, a methylphenyl group, and a methoxyphenyl group, and $R^{13c}$ is a methyl group, when n is 1; and specific examples thereof include α-(methylsulfonyloxyimino)-1-phenylacetonitrile, α-(methylsulfonyloxyimino)-1-(p-methylphenyl) acetonitrile, α-(methylsulfonyloxyimino)-1-(p-methoxyphenyl) acetonitrile, and [2-(propylsulfonyloxyimino)-2,3-dihydroxythiophene-3-ylidene](o-tolyl) acetonitrile. When n is 2, specific examples of the photoacid generator represented by the formula (c4) include photoacid generators represented by the following formulae.

[Chemical formula 23]

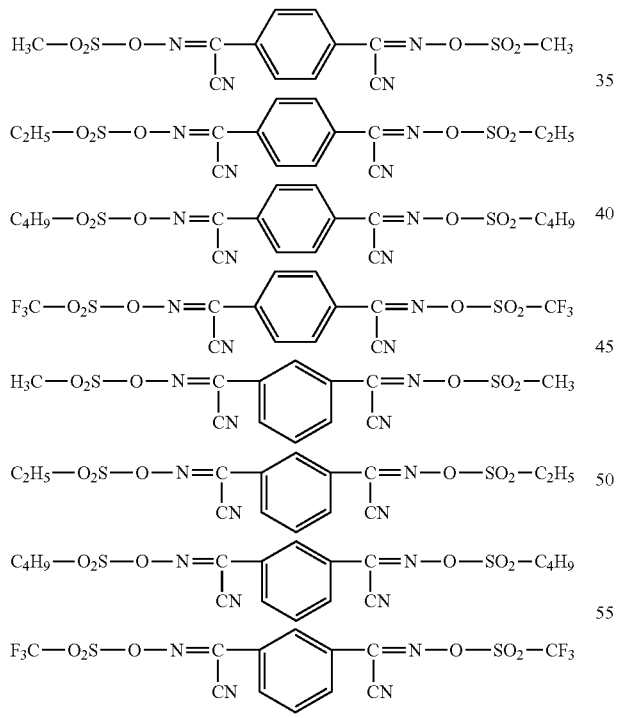

In addition, the fourth aspect of the component (C) may include onium salts that have a naphthalene ring at their cation moiety. The expression "have a naphthalene ring" indicates a structure derived from naphthalene and also indicates at least two ring structures and their aromatic properties are maintained. The naphthalene ring may have a substituent such as a linear or branched alkyl group having 1 to 6 carbon atoms, a hydroxyl group, and a linear or branched alkoxy group having 1 to 6 carbon atoms. The structure derived from the naphthalene ring, which may be of a monovalent group (one free valance) or of a di- or higher valent group (two or more free valences), is desirably of a monovalent group (in this regard, the number of free valance is counted except for the portions connecting with the substituents as described above). The number of naphthalene rings is preferably 1 to 3.

The cation moiety of the onium salt having a naphthalene ring at such a cation moiety is preferably a structure represented by the following formula (c5).

[Chemical formula 24]

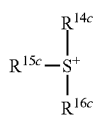

(c5)

In the formula (c5), at least one of $R^{14c}$, $R^{15c}$, and $R^{16c}$ represents a group represented by the following formula (c6), and the remaining represents a linear or branched alkyl group having 1 to 6 carbon atoms, a phenyl group which may have a substituent, a hydroxyl group, or a linear or branched alkoxy group having 1 to 6 carbon atoms. Alternatively, one of $R^{14c}$, $R^{15c}$, and $R^{16c}$ is a group represented by the following formula (c6), and the remaining two are each independently a linear or branched alkylene group having 1 to 6 carbon atoms, and terminals thereof may be bonded to each other to form a ring structure.

[Chemical formula 25]

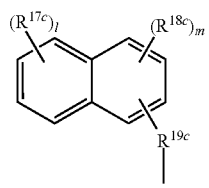

(c6)

In the formula (c6), $R^{17c}$ and $R^{18c}$ each independently represent a hydroxyl group, a linear or branched alkoxy group having 1 to 6 carbon atoms, or a linear or branched alkyl group having 1 to 6 carbon atoms; and $R^{19c}$ represents a single bond or a linear or branched alkylene group having 1 to 6 carbon atoms that may have a substituent. l and m each independently represent an integer of 0 to 2, and l+m is 3 or less. In this regard, when there exists a plurality of $R^{17c}$, they may be the same as or different from each other. Further, when there exist a plurality of $R^{18c}$, they may be the same as or different from each other.

Preferably, among $R^{14c}$, $R^{15c}$, and $R^{16c}$ as above, the number of groups represented by the formula (c6) is one in view of the stability of the compound, and the remaining are linear or branched alkylene groups having 1 to 6 carbon atoms of which the terminals may be bonded to each other to form a ring. In this case, the two alkylene groups described above form a 3- to 9-membered ring including sulfur atom(s). The number of atoms which form the ring (including sulfur atom(s)) is preferably 5 or 6.

Furthermore, examples of the substituent which the alkylene group may have include an oxygen atom (in this case, a carbonyl group is formed together with a carbon atom that constitutes the alkylene group) and a hydroxyl group.

Incidentally, examples of the substituent which the phenyl group may have include a hydroxyl group, a linear or branched alkoxy group having 1 to 6 carbon atoms and a linear or branched alkyl group having 1 to 6 carbon atoms.

Suitable examples of the cation moiety include those represented by the following formulae (c7) and (c8), and the structure represented by the following formula (c8) is particularly preferred.

[Chemical formula 26]

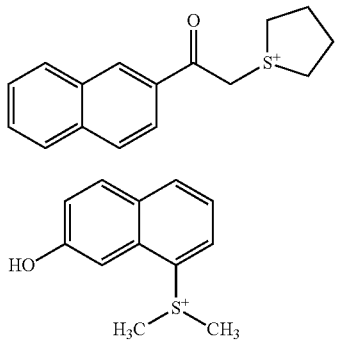

(c7)

(c8)

The cation moiety may be an iodonium salt or a sulfonium salt, but is desirably a sulfonium salt in view of acid-generating efficiency or the like.

Therefore, a suitable anion moiety of the onium salt having a naphthalene ring at the cation moiety is desirably an anion capable of forming a sulfonium salt.

Examples of the anion moiety of the acid generator include fluoroalkylsulfonic acid ions, of which hydrogen atom(s) is partially or entirely fluorinated, or aryl sulfonic acid ions.

The alkyl group of the fluoroalkylsulfonic acid ions may be linear, branched, or cyclic and have 1 to 20 carbon atoms. Preferably, the carbon number is 1 to 10 in view of bulkiness and diffusion distance of the produced acid. In particular, branched or cyclic groups are preferred since they have a shorter diffusion length. Also, a methyl group, an ethyl group, a propyl group, a butyl group, an octyl group, and the like may be preferred since they can be synthesized inexpensively.

The aryl group in the aryl sulfonic acid ions may be an aryl group having 6 to 20 carbon atoms, and examples thereof include a phenyl group and a naphthyl group, which may be unsubstituted or substituted with an alkyl group or a halogen atom. In particular, aryl groups having 6 to 10 carbon atoms are preferred since they can be synthesized inexpensively. Preferable specific examples of the aryl group include a phenyl group, a toluenesulfonyl group, an ethylphenyl group, a naphthyl group, and a methylnaphthyl group.

In the case where hydrogen atoms in the fluoroalkylsulfonic acid ion or the aryl sulfonic acid ion are partially or entirely substituted with a fluorine atom, the fluorination rate is preferably 10% to 100%, and more preferably 50% to 100%; it is particularly preferable that all hydrogen atoms be each substituted with a fluorine atom due to higher acid strength. Specific examples thereof include trifluoromethane sulfonate, perfluorobutane sulfonate, perfluorooctane sulfonate, and perfluorobenzene sulfonate.

Among these, preferable examples of the anion moiety include those represented by the following formula (c9).

[Chemical formula 27]

$R^{20c}SO_3$ (c9)

In the formula (c9), $R^{20c}$ represents a group represented by the following formula (c10) or (c11), or a group represented by the following formula (c12).

[Chemical formula 28]

—$C_xF_{2x+1}$ (c10)

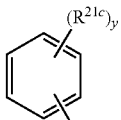

(c11)

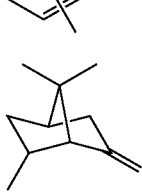

(c12)

In the formula (c10), x represents an integer of 1 to 4. Also, in the formula (c11), $R^{21c}$ represents a hydrogen atom, a hydroxyl group, a linear or branched alkyl group having 1 to 6 carbon atoms, or a linear or branched alkoxy group having 1 to 6 carbon atoms; and y represents an integer of 1 to 3. Of these, trifluoromethane sulfonate, and perfluorobutane sulfonate are preferable in view of safety.

In addition, a nitrogen-containing one represented by the following formula (c13) or (c14) may also be used as the anion moiety.

[Chemical formula 29]

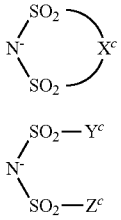

(c13)

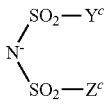

(c14)

In the formulae (c13) and (c14), $X^c$ represents a linear or branched alkylene group of which at least one hydrogen atom is substituted with a fluorine atom, the carbon number of the alkylene group is 2 to 6, preferably 3 to 5, and most preferably 3. In addition, $Y^c$ and $Z^c$ each independently represent a linear or branched alkyl group of which at least one hydrogen atom is substituted with a fluorine atom, the carbon number of the alkyl group is 1 to 10, preferably 1 to 7, and more preferably 1 to 3.

The smaller number of carbon atoms in the alkylene group of $X^c$, or in the alkyl group of $Y^c$ or $Z^c$ is preferred since the solubility into an organic solvent is preferable.

In addition, a larger number of hydrogen atoms each substituted by a fluorine atom in the alkylene group of $X^c$, or in the alkyl group of $Y^c$ or $Z^c$ is preferred since the acid strength becomes greater. The percentage of fluorine atoms in the alkylene group or an alkyl group, i.e., the fluorination rate is preferably 70% to 100% and more preferably 90% to 100%, and most preferred are perfluoroalkylene or perfluoroalkyl groups in which all of the hydrogen atoms are each substituted with a fluorine atom.

Preferable examples of the onium salts having a naphthalene ring at their cation moieties include compounds represented by the following formulae (c15) and (c16).

[Chemical formula 30]

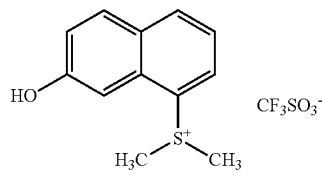
(c15)

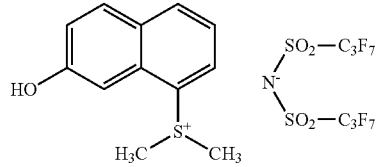
(c16)

Also, the fifth aspect of the component (C) may include bissulfonyldiazomethanes such as bis(p-toluenesulfonyl)diazomethane, bis(1,1-dimethylethylsulfonyl)diazomethane, bis(cyclohexylsulfonyl)diazomethane, and bis(2,4-dimethylphenylsulfonyl)diazomethane; nitrobenzyl derivatives such as 2-nitrobenzyl p-toluenesulfonate, 2,6-dinitrobenzyl p-toluenesulfonate, nitrobenzyl tosylate, dinitrobenzyl tosylate, nitrobenzyl sulfonate, nitrobenzyl carbonate, and dinitrobenzyl carbonate; sulfonates such as pyrogalloltrimesylate, pyrogalloltritosylate, benzyltosylate, benzylsulfonate, N-methylsulfonyloxysuccinimide, N-trichloromethylsulfonyloxysuccinimide, N-phenylsulfonyloxymaleimide, and N-methylsulfonyloxyphthalimide; trifluoromethane sulfonates such as N-hydroxyphthalimide and N-hydroxynaphthalimide; onium salts such as diphenyliodonium hexafluorophosphate, (4-methoxyphenyl)phenyliodonium trifluoromethanesulfonate, bis(p-tert-butylphenyl)iodonium trifluoromethanesulfonate, triphenylsulfonium hexafluorophosphate, (4-methoxyphenyl)diphenylsulfonium trifluoromethanesulfonate, and (p-tert-butylphenyl)diphenylsulfonium trifluoromethanesulfonate; benzointosylates such as benzointosylate and α-methylbenzointosylate; and other diphenyliodonium salts, triphenylsulfonium salts, phenyldiazonium salts, and benzylcarbonates.

The content of the component (C) is not particularly limited as long as the purpose of the present invention is not impaired. The content is preferably 0.1% by mass to 10% by mass, and more preferably 0.5% by mass to 3% by mass, with respect to the total mass of the chemically amplified positive-type photosensitive resin composition.

Alkali-soluble Resin (D)

The chemically amplified positive-type photosensitive resin composition may further contain an alkali-soluble resin (D) (hereinafter also referred to as a "component (D)") in order to improve crack resistance. The alkali-soluble resin as mentioned herein may be determined as follows. A solution of the resin having a resin concentration of 20% by mass (solvent: propylene glycol monomethyl ether acetate) is used to form a resin film having a film thickness of 1 μm on a substrate, and immersed in an aqueous 2.38%-by-mass TMAH solution for 1 minute. If the resin was dissolved in an amount of 0.01 μm or more, the resin is defined to be alkali-soluble. The component (D) may be used alone or in combination of two or more kinds thereof. Preferable examples of the alkali-soluble resin (D) include a novolak resin (D1), a polyhydroxystyrene resin (D2), and an acrylic resin (D3).

Novolak Resin (D1)

The novolak resin (D1) may be prepared by addition condensation between, for example, aromatic compounds having a phenolic hydroxy group (hereinafter merely referred to as "phenols") and aldehydes in the presence of an acid catalyst.

Examples of the phenols include phenol, o-cresol, m-cresol, p-cresol, o-ethylphenol, m-ethylphenol, p-ethylphenol, o-butylphenol, m-butylphenol, p-butylphenol, 2,3-xylenol, 2,4-xylenol, 2,5-xylenol, 2,6-xylenol, 3,4-xylenol, 3,5-xylenol, 2,3,5-trimethyl phenol, 3,4,5-trimethyl phenol, p-phenylphenol, resorcinol, hydroquinone, hydroquinone monomethyl ether, pyrogallol, phloroglycinol, hydroxydiphenyl, bisphenol A, gallic acid, gallic acid ester, α-naphthol, and β-naphthol.

Examples of the aldehydes include formaldehyde, furfural, benzaldehyde, nitrobenzaldehyde, and acetaldehyde.

The catalyst used in the addition condensation reaction is not particularly limited, but examples thereof include, as an acid catalyst, hydrochloric acid, nitric acid, sulfuric acid, formic acid, oxalic acid, and acetic acid.

Furthermore, the flexibility of the novolak resins can be enhanced even more when o-cresol is used, a hydrogen atom of a hydroxyl group in the resins is substituted with other substituents, or bulky aldehydes are used.

The mass average molecular weight of the novolak resin (D1) is preferably 1,000 to 50,000.

Polyhydroxystyrene Resin (D2)

Examples of the hydroxystyrene-based compound constituting the polyhydroxystyrene resin (D2) include p-hydroxystyrene, α-methylhydroxystyrene, and α-ethylhydroxystyrene.

Incidentally, the polyhydroxystyrene resin (D2) is preferably prepared to give a copolymer with a styrene resin. Examples of the styrene-based compound constituting the styrene resin include styrene, chlorostyrene, chloromethylstyrene, vinyltoluene, and α-methylstyrene.

The mass average molecular weight of the polyhydroxystyrene resin (D2) is preferably 1,000 to 50,000.

Acrylic Resin (D3)

The acrylic resin (D3) includes a structural unit derived from a (meth)acrylic acid or a (meth)acrylic acid derivative, such as (meth)acrylic acid, (meth)acrylate, and (meth)acrylic amide, and is not particularly limited as long as it has a predetermined solubility in alkali.

It is preferable that the acrylic resin (D3) contain a structural unit derived from a polymerizable compound containing a carboxyl group. Examples of the polymerizable compound including a carboxyl group include monocarboxylic acids such as acrylic acid, methacrylic acid, and crotonic acid; dicarboxylic acids such as maleic acid, fumaric acid, and itaconic acid; and a compound including a carboxyl group and an ester bond such as 2-methacryloyloxyethyl succinic acid, 2-methacryloyloxyethyl maleic acid, 2-methacryloyloxyethyl phthalic acid, or 2-methacryloyloxyethyl hexahydrophthalic acid. The polymerizable compound including a carboxyl group is preferably acrylic acid or methacrylic acid. These polymerizable compounds may be used alone or in combination of two or more kinds thereof.

It is preferable that the acrylic resin (D3) contain a structural unit derived from a polymerizable compound including a carboxyl group and a structural unit derived from a C3 to C12 linear alkyl ester of a (meth)acrylic acid. When the acrylic resin (D3) contains such a unit, generation of bubbles in a film to be formed is easily suppressed.

Preferable specific examples of the C3 to C12 linear alkyl ester of a (meth)acrylic acid include n-butyl(meth)acrylate, n-octyl(meth)acrylate, and n-decyl(meth)acrylate.

It is preferable that the acrylic resin (D3) as described above contain a structural unit derived from a polymerizable compound including a carboxyl group and a structural unit derived from a C3 to C12 linear alkyl ester of a (meth)acrylic acid.

In addition, the acrylic resin (D3) may contain a structural unit derived from a polymerizable compound other than the C3 to C12 linear alkyl(meth)acrylic ester and a polymerizable compound including a carboxyl group.

Examples of such a polymerizable compound include (meth)acrylic acid derivatives containing an ether bond and an ester bond, such as 2-methoxyethyl(meth)acrylate, methoxytriethylene glycol(meth)acrylate, 3-methoxybutyl(meth)acrylate, ethylcarbitol(meth)acrylate, phenoxypolyethylene glycol(meth)acrylate, methoxypolypropylene glycol(meth)acrylate, and tetrahydrofurfuryl(meth)acrylate; (meth)acrylic acid hydroxyalkyl esters such as 2-hydroxyethyl (meth)acrylate and 2-hydroxypropyl(meth)acrylate; (meth)acrylic acid esters including a group which contains an aromatic group such as phenyl(meth)acrylate and benzyl (meth)acrylate; dicarboxylic acid diesters such as diethyl maleate and dibutyl fumarate; vinyl group-containing aromatic compounds such as styrene, α-methylstyrene, chlorostyrene, chloromethylstyrene, vinyltoluene, hydroxystyrene, α-methyl hydroxystyrene, and α-ethylhydroxystyrene; vinyl group-containing aliphatic compounds such as vinyl acetate; conjugated diolefins such as butadiene and isoprene; nitrile group-containing polymerizable compounds such as acrylonitrile and methacrylonitrile; chlorine-containing polymerizable compounds such as vinyl chloride and vinylidene chloride; and amide bond-containing polymerizable compounds such as acrylamide and methacrylamide.

The mass average molecular weight of the acrylic resin (D3) is preferably 50,000 to 800,000.

The content of the component (D), in the case where the total amount of the component (B) and the component (D) is taken as 100 parts by mass, is preferably 0 parts by mass to 80 parts by mass, and more preferably 0 parts by mass to 60 parts by mass. By adjusting the content of the component (D) to the range described above, there is a tendency for resistance to crack to increase, and for film loss at the time of development to be prevented.

Acid Diffusion Control Agent (E)

In order to improve the resist pattern shape, the post exposure stability, and the like, the chemically amplified positive-type photosensitive resin composition may further contain an acid diffusion control agent (E) (hereinafter also referred to as a "component (E)"). The components (E) may be used singly or in combination of two or more kinds thereof. The acid diffusion control agent (E) is preferably a nitrogen-containing compound (E1), and an organic carboxylic acid, or an oxo acid of phosphorus or a derivative thereof (E2) may be further included as needed.

Nitrogen-containing Compound (E1)

Examples of the nitrogen-containing compound (E1) include trimethylamine, diethylamine, triethylamine, di-n-propylamine, tri-n-propylamine, tri-n-pentylamine, tribenzylamine, diethanolamine, triethanolamine, n-hexylamine, n-heptylamine, n-octylamine, n-nonylamine, ethylenediamine, N,N,N',N'-tetramethylethylenediamine, tetramethylenediamine, hexamethylenediamine, 4,4'-diaminodiphenylmethane, 4,4'-diaminodiphenylether, 4,4'-diaminobenzophenone, 4,4'-diaminodiphenylamine, formamide, N-methylformamide, N,N-dimethylformamide, acetamide, N-methylacetamide, N,N-dimethylacetamide, propionamide, benzamide, pyrrolidone, N-methylpyrrolidone, methylurea, 1,1-dimethylurea, 1,3-dimethylurea, 1,1,3,3,-tetramethylurea, 1,3-diphenylurea, imidazole, benzimidazole, 4-methylimidazole, 8-oxyquinoline, acridine, purine, pyrrolidine, piperidine, 2,4,6-tri(2-pyridyl)-S-triazine, morpholine, 4-methylmorpholine, piperazine, 1,4-dimethylpiperazine, 1,4-diazabicyclo[2.2.2]octane, and pyridine. These may be used alone or in combination of two or more kinds thereof.

The nitrogen-containing compound (E1) may be used in an amount preferably in the range of 0 parts by mass to 5 parts by mass, and particularly preferably in the range of 0 parts by mass to 3 parts by mass, with respect to 100 parts by mass of total mass of the component (B) and the component (D).

Organic Carboxylic Acid or Oxo Acid of Phosphorus or Derivative Thereof (E2)

Among the organic carboxylic acid, or the oxo acid of phosphorus or a derivative thereof (E2), specific preferable examples of the organic carboxylic acid include malonic acid, citric acid, malic acid, succinic acid, benzoic acid, and salicylic acid, and salicylic acid is particularly preferred.

Examples of the oxo acid of phosphorus or a derivative thereof include phosphoric acid and derivatives thereof such as esters thereof such as, for example, phosphoric acid, phosphoric acid di-n-butyl ester, and phosphoric acid diphenyl ester; phosphonic acid and derivatives thereof such as esters thereof such as, for example, phosphonic acid, phosphonic acid dimethyl ester, phosphonic acid di-n-butyl ester, phenylphosphonic acid, phosphonic acid diphenyl ester, and phosphonic acid dibenzyl ester; and phosphinic acid and derivatives thereof such as esters thereof such as, for example, phosphinic acid and phenylphosphinic acid; and the like. Among these, phosphonic acid is particularly preferred. These may be used alone or in combination of two or more kinds thereof.

The organic carboxylic acid, or the oxo acid of phosphorus or the derivative thereof (E2) may be used in an amount preferably in the range of 0 parts by mass to 5 parts by mass, and particularly preferably in the range of 0 parts by mass to 3 parts by mass, with respect to 100 parts by mass of total mass of the component (B) and the component (D).

Moreover, in order to form a salt to allow for stabilization, the organic carboxylic acid, or the oxo acid of phosphorous or the derivative thereof (E2) is preferably used in an amount equivalent to that of the nitrogen-containing compound (E1).

Organic Solvent (S)

The chemically amplified positive-type photosensitive resin composition according to the present invention may contain an organic solvent (S), and as a result, the coatability of the chemically amplified positive-type photosensitive resin composition, or the film thickness of the photosensitive resin layer formed by using the chemically amplified positive-type photosensitive resin composition can be easily adjusted. The components (S) may be used singly or in combination of two or more kinds thereof.

The component (S) is a compound other than the component (A), and specific examples of the component (S) include ketones such as acetone, methyl ethyl ketone, cyclohexanone, methyl isoamyl ketone, and 2-heptanone; polyols and derivatives thereof, such as ethylene glycol, ethylene glycol monoacetate, diethylene glycol, diethylene glycol monoacetate, propylene glycol, propylene glycol monoacetate, dipropylene glycol, and dipropylene glycol monoacetate and monomethyl ethers, monoethyl ethers, monopropyl ethers, monobutyl ethers, and monophenyl ethers thereof; cyclic ethers such as dioxane; esters such as ethyl formate, methyl lactate, ethyl lactate, methyl acetate, ethyl acetate, butyl acetate, methyl pyruvate, methyl acetoacetate, ethyl acetoacetate, methyl pyruvate, ethyl ethoxy acetate, methyl methoxypropionate, ethyl ethoxypropionate, methyl 2-hydroxypropionate, ethyl 2-hydroxypropionate, ethyl 2-hydroxy-2-methylpropionate, methyl 2-hydroxy-3-methylbutanate, 3-methoxybutyl acetate, and 3-methyl-3-methoxybutyl acetate; and aromatic hydrocarbons such as toluene and xylene.

The content of the organic solvent (S) is an amount such that a photosensitive resin layer obtainable by a spin-coating method or the like has a film thickness of 1 μm or more, and the solid content concentration of the chemically amplified positive-type photosensitive resin composition is 30% by mass to 65% by mass, and preferably an amount such that the solid concentration is 40% by mass to 60% by mass.

Other Components

The chemically amplified positive-type photosensitive resin composition may further contain a polyvinyl resin in order to improve the plasticity of the formed film. Specific examples of the polyvinyl resin include polyvinyl chloride, polystyrene, polyhydroxystyrene, polyvinyl acetate, polyvinylbenzoic acid, polyvinyl methyl ether, polyvinyl ethyl ether, polyvinyl alcohol, polyvinyl pyrrolidone, polyvinyl phenol, and copolymers thereof. The polyvinyl resin is preferably polyvinyl methyl ether in view of a lower glass transition temperature.

The chemically amplified positive-type photosensitive resin composition may further contain an adhesion aid in order to improve the adhesiveness to the support.

The chemically amplified positive-type photosensitive resin composition may further contain a surfactant for improving coating characteristics, defoaming characteristics, leveling characteristics, and the like. Specific examples of the surfactant include commercially available fluorochemical surfactants such as BM-1000 and BM-1100 (both manufactured by B.M-Chemie Co., Ltd.), Megafac F142D, Megafac F172, Megafac F173, and Megafac F183 (all manufactured by Dainippon Ink And Chemicals, Incorporated), Flolade FC-135, Flolade FC-170C, Flolade FC-430, and Flolade FC-431 (all manufactured by Sumitomo 3M Ltd.), Surflon S-112, Surflon S-113, Surflon S-131, Surflon S-141, and Surflon S-145 (all manufactured by Asahi Glass Co., Ltd.), SH-28PA, SH-190, SH-193, SZ-6032, and SF-8428 (all manufactured by Toray Silicone Co., Ltd.), but are not limited thereto.

The chemically amplified positive-type photosensitive resin composition may further contain an acid or an acid anhydride in order to finely adjust the solubility in a developing solution.

Specific examples of the acid and the acid anhydride include monocarboxylic acids such as acetic acid, propionic acid, n-butyric acid, isobutyric acid, n-valeric acid, isovaleric acid, benzoic acid, and cinnamic acid; hydroxymonocarboxylic acids such as lactic acid, 2-hydroxybutyric acid, 3-hydroxybutyric acid, salicylic acid, m-hydroxybenzoic acid, p-hydroxybenzoic acid, 2-hydroxycinnamic acid, 3-hydroxycinnamic acid, 4-hydroxycinnamic acid, 5-hydroxyisophthalic acid, and syringic acid; polyvalent carboxylic acids such as oxalic acid, succinic acid, glutaric acid, adipic acid, maleic acid, itaconic acid, hexahydrophthalic acid, phthalic acid, isophthalic acid, terephthalic acid, 1,2-cyclohexanedicarboxylic acid, 1,2,4-cyclohexanetricarboxylic acid, butanetetracarboxylic acid, trimellitic acid, pyromellitic acid, cyclopentanetetracarboxylic acid, butanetetracarboxylic acid, and 1,2,5,8-naphthalenetetracarboxylic acid; and acid anhydrides such as itaconic anhydride, succinic anhydride, citraconic anhydride, dodecenylsuccinic anhydride, tricarbanilic anhydride, maleic anhydride, hexahydrophthalic anhydride, methyltetrahydrophthalic anhydride, Himic anhydride, 1,2,3,4-butanetetracarboxylic anhydride, cyclopentanetetracarboxylic dianhydride, phthalic anhydride, pyromellitic anhydride, trimellitic anhydride, benzophenonetetracarboxylic anhydride, ethylene glycol bis anhydrous trimellitate, and glycerin tris anhydrous trimellitate.

Method for Preparing Chemically Amplified Positive-type Photosensitive Resin Composition The chemically amplified positive-type photosensitive resin composition according to the present invention can be prepared by only mixing and stirring each of the aforementioned components by a conventional method. Each of the aforementioned components may be dispersed and mixed using dispersion equipment such as a dissolver, a homogenizer, or a three-roll mill, if necessary. After mixing, the mixture may further be filtrated using a mesh, a membrane filter, or the like.

Method for Producing Resist Pattern

The method for producing a resist pattern according to the present invention includes a photosensitive resin layer-forming step of forming a photosensitive resin layer containing the chemically amplified positive-type photosensitive resin composition according to the present invention on a substrate, an exposure step of selectively exposing the photosensitive resin layer, and a developing step of developing the exposed photosensitive resin layer.

The substrate is not particularly limited, and substrates known in the related art can be used. Examples thereof include substrates for electronic parts, including the substrates having predetermined wiring patterns formed thereon. Examples of the substrate include substrates made of metals such as silicon, silicon nitride, titanium, tantalum, palladium, titanium-tungsten, copper, chromium, iron, and aluminum; and glass substrates. As the material used for the wiring patterns, copper, solder, chromium, aluminum, nickel, gold, or the like is used.

First, in the photosensitive resin layer-forming step, the chemically amplified positive-type photosensitive resin composition according to the present invention is coated on a substrate, and the solvent is removed by heating (prebaking), thereby forming a photosensitive resin layer. As a method for coating the solution on a substrate, a method such as a spin-coating method, a slit-coating method, a roll-coating method, a screen-printing method, and an applicator method may be employed.

Incidentally, the prebaking conditions may vary depending on the composition of the chemically amplified positive-type photosensitive resin composition according to the present invention, the film thickness of the photosensitive resin layer, or the like, but the conditions are usually 70° C. to 150° C., and preferably 80° C. to 140° C. for about 2 minutes to 60 minutes.

The film thickness of the photosensitive resin layer is preferably 1 μm or more, and more preferably 20 μm to 75 μm.

Then, in the exposure step, the obtained photosensitive resin layer is selectively irradiated (exposed) with an electromagnetic wave or radiation including particle beam, for example, ultraviolet radiation having a wavelength of 300 nm to 500 nm, or visible light, through a mask of a predetermined pattern.

Low pressure mercury lamps, high pressure mercury lamps, ultra high-pressure mercury lamps, metal halide lamps, argon gas lasers, or the like can be used for the light source of the radiation. Examples of the radiation include micro waves, infrared rays, visible lights, ultraviolet rays, X-rays, γ-rays, electron beams, proton beams, neutron beams, and ion beams. The irradiation dose of the radiation may vary depending on the composition of the chemically amplified positive-type photosensitive resin composition according to the present invention, the film thickness of the photosensitive resin layer, and the like. For example, in the case where an ultra high-pressure mercury lamp is used, the dose is 100 mJ/cm$^2$ to 10,000 mJ/cm$^2$. Further, the radiation includes a light ray which activates the photoacid generator (C) in order to generate an acid.

After the exposure, diffusion of the acid is promoted through heating by methods known in the related art, followed by changing the alkali solubility of the photosensitive resin layer in this exposed area.

Next, in the developing step, for example, a predetermined aqueous alkaline solution is used as a developing solution to dissolve and remove unwanted portions, thereby obtaining a predetermined resist pattern.

As the developing solution, an aqueous solution of an alkali such as, for example, sodium hydroxide, potassium hydroxide, sodium carbonate, sodium silicate, sodium metasilicate, aqueous ammonia, ethylamine, n-propylamine, diethylamine, di-n-propylamine, triethylamine, methyldiethylamine, dimethylethanolamine, triethanolamine, tetramethylammonium hydroxide, tetraethylammonium hydroxide, pyrrole, piperidine, 1,8-diazabicyclo[5.4.0]-7-undecene, and 1,5-diazabicyclo[4.3.0]-5-nonane can be used. Also, an aqueous solution prepared by adding an appropriate amount of a water-soluble organic solvent such as methanol and ethanol, or a surfactant to the aqueous solution of the alkali can be used as the developing solution.

The developing time may vary depending on the composition of the chemically amplified positive-type photosensitive resin composition according to the present invention, the film thickness of the photosensitive resin layer, or the like. The developing time is usually from 1 minutes to 30 minutes. The developing method may be any one of a liquid-filling method, a dipping method, a paddle method, and a spray developing method.

After development, washing with flowing water is carried out for 30 seconds to 90 seconds, and drying is performed by using an air gun, an oven, or the like.

Connecting terminals such as bumps and metal posts can be formed by embedding a conductor such as a metal, by means of plating or the like, in a nonresist section (an area that has been removed by a developing liquid) of the resist pattern obtained as described above. Further, there are no particular limitations on the plating treatment method, and various methods that are conventionally known can be employed. As the plating liquid, liquids for solder plating, copper plating, gold plating, and nickel plating, in particular, are suitably used. Finally, any residual resist pattern is removed by using a stripping solution or the like according to a standard method.

EXAMPLES

Hereinafter, the present invention will be described in more detail with reference to Examples, but the scope of the present invention is not limited to these Examples.

Examples 1 to 3 and Comparative Examples 1 and 2

The components (A) to (E) shown in Table 1 were uniformly dissolved in the organic solvent (S) to prepare a chemically amplified positive-type photosensitive resin composition. The numerical values in parentheses in Table 1 represent the blending amount (unit: parts by mass) of each of the components. Further, the melting point and the boiling point below are values at 1 atm.

A-1: Compound represented by the following formula (melting point: 29° C. to 32° C., boiling point: 250° C.)

[Chemical formula 31]

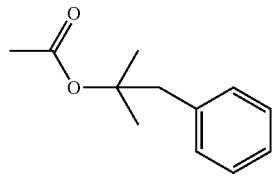

A-2: Compound represented by the following formula (melting point: <−20° C., boiling point: 232° C.)

[Chemical formula 32]

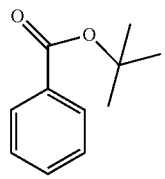

A-3: Compound represented by the following formula (melting point: 17° C., boiling point: 220° C.)

[Chemical formula 33]

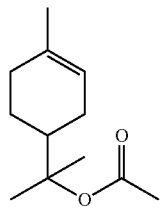

GBL: γ-Butyrolactone (melting point: −45° C., boiling point: 204° C.)

B-1: Acrylic resin represented by the following formula (mass average molecular weight of 100,000)

Further, the numerical values included in the respective repeating units in the following formula represent the proportions (mol %) of the mole numbers of the respective repeating units with respect to the mole number of all the repeating units contained in the acrylic resin.

TABLE 1

|  | Compound (A) | Resin (B) | Resin (D) | Photoacid generator (C) | Acid diffusion control agent (E) | Organic solvent (S) |
|---|---|---|---|---|---|---|
| Example 1 | A-1 (9.0) | B-1 (12) | D-1 (6.0) D-2 (12) | C-1 (2.0) | E-1 (0.02) | PM (11) MA (24) |
| Example 2 | A-2 (9.0) | B-1 (12) | D-1 (6.0) D-2 (12) | C-1 (2.0) | E-1 (0.02) | PM (11) MA (24) |
| Example 3 | A-3 (9.0) | B-1 (12) | D-1 (6.0) D-2 (12) | C-1 (2.0) | E-1 (0.02) | PM (11) MA (24) |
| Comparative Example 1 | — | B-1 (12) | D-1 (6.0) D-2 (12) | C-1 (2.0) | E-1 (0.02) | PM (11) MA (24) |
| Comparative Example 2 | GBL (9.0) | B-1 (12) | D-1 (6.0) D-2 (12) | C-1 (2.0) | E-1 (0.02) | PM (11) MA (24) |

[Chemical formula 34]

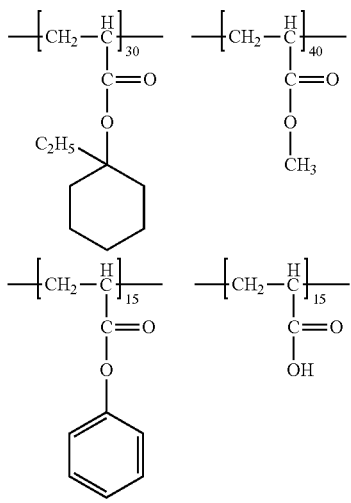

D-1: Polyhydroxystyrene resin (mass average molecular weight of 10,000)

D-2: Novolak resin (novolak resin obtained by mixing m-cresol and p-cresol to afford a ratio of m-cresol/p-cresol=60/40 (ratio by mass), followed by addition condensation in the presence of formaldehyde and an acid catalyst) (mass average molecular weight of 8,000)

C-1: Compound represented by the following formula

[Chemical formula 35]

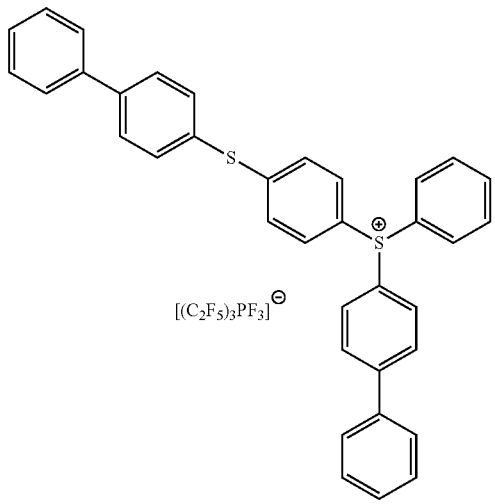

E-1: Tri-n-pentylamine
PM: Propylene glycol monomethylether acetate
MA: 3-Methoxybutylacetate <Evaluation>
[Residual Rate of Liquid Components and Sensitivity]

The chemically amplified positive-type photosensitive resin compositions prepared in Examples or Comparative Examples above were coated on a copper substrate using a spin coater, thereby obtaining a photosensitive resin layer having a film thickness of 65 μm. Further, this photosensitive resin layer was prebaked at 150° C. for 5 minutes. After prebaking, it was subjected to patternwise exposure to line ghi, by using a mask with a predetermined line pattern and an exposing apparatus Prisma GHI (manufactured by Ultratech, Inc.). Subsequently, the substrate was placed on a hot plate and post-exposure heating (PEB) was carried out for 3 minutes at 95° C. Thereafter, an aqueous 2.38%-by-mass tetramethylammonium hydroxide (TMAH) solution was added dropwise to the photosensitive resin layer and then the photosensitive resin layer was left to stand at 23° C. for 60 seconds. This operation was repeated 4 times for developing. Thereafter, the layer was washed with flowing water and then subjected to nitrogen blowing to obtain a resist pattern.

The residual amount of the liquid components (the component (A) or the component (S)) in the photosensitive resin layer after prebaking was measured by gas chromatography, and the ratio of the residual amount to the amount of the liquid components used for the preparation of the chemically amplified positive-type photosensitive resin composition was determined and taken as a residual rate of the liquid components. The results are shown in Table 2.

When the resist pattern was obtained, stepwise exposure was carried out in the range of 50 mJ/cm$^2$ to 4000 mJ/cm$^2$ in order to evaluate the sensitivity, an exposure dose required to form a 100 μm line pattern/100 μm space pattern having high rectangularity was measured, and this exposure dose was taken as sensitivity. The results are shown in Table 2.

TABLE 2

| | Residual rate | | | | | | Sensitivity |
| --- | --- | --- | --- | --- | --- | --- | --- |
| | A-1 | A-2 | A-3 | GBL | PM | MA | (mJ/cm$^2$) |
| Example 1 | 4.5 | — | — | — | 0.6 | 3.3 | 100 |
| Example 2 | — | 6.6 | — | — | 0.7 | 3.7 | 100 |
| Example 3 | — | — | 9.2 | — | 0.5 | 2.7 | 100 |
| Comparative Example 1 | — | — | — | — | 1.8 | 5.7 | 150 |
| Comparative Example 2 | — | — | — | 2.5 | 0.6 | 3.5 | 150 |

As seen from Table 2, in Examples 1 to 3, compositions containing the compound represented by the formula (1) were used, and as a result, a substantial amount of the compound represented by the formula (1) remained in the photosensitive resin layer even after prebaking, and thus, a resist pattern having high rectangularity could be obtained at a less exposure dose.

To the contrary, in Comparative Example 1, composition not containing the compound represented by the formula (1) was used, and as a result, a larger exposure dose was required to obtain a resist pattern having high rectangularity, as compared with Examples 1 to 3. Further, in Comparative Example 2, composition containing γ-butyrolactone instead of the compound represented by the formula (1) was used, and as a result, the amount of the γ-butyrolactone remaining in the photosensitive resin layer even after prebaking was smaller than that of the compound represented by the formula (1), and thus, a larger exposure dose was required to obtain a resist pattern having high rectangularity, as compared with Examples 1 to 3.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A chemically amplified positive-type photosensitive resin composition, comprising:
   a compound represented by the following formula (1), having a melting point of 40° C. or lower at 1 atm;
   a resin whose solubility in alkali increases under the action of an acid; and a photoacid generator,

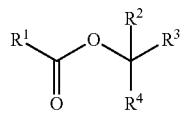 (1)

wherein in the formula (1), $R^1$ a hydrogen atom or an unsubstituted alkyl, cycloalkyl, alkenyl, cycloalkenyl, aryl or aralkyl group $R^2$, and $R^3$ independently represent a monovalent hydrocarbon group which may have a substituent except a halogen atom; $R^4$ independently represents a monovalent hydrocarbon group selected from the group consisting of a cycloalkenyl group and an aralkyl group, each of which may have a substituent.

2. The chemically amplified positive-type photosensitive resin composition according to claim 1, wherein a boiling point of the compound represented by formula (1) at 1 atm is 100° C. or higher.

3. A method for producing a resist pattern, comprising:
forming a photosensitive resin layer containing the chemically amplified positive-type photosensitive resin composition according to claim 1 on a substrate;
selectively exposing the photosensitive resin layer; and
developing the exposed photosensitive resin layer.

4. The method for producing a resist pattern according to claim 1, wherein a film thickness of the photosensitive resin layer is 1 μm or more.

* * * * *